(12) United States Patent
Sakamoto

(10) Patent No.: US 7,952,339 B2
(45) Date of Patent: May 31, 2011

(54) SEMICONDUCTOR CIRCUIT

(75) Inventor: Kozo Sakamoto, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 447 days.

(21) Appl. No.: 12/028,364

(22) Filed: Feb. 8, 2008

(65) Prior Publication Data

US 2008/0205100 A1     Aug. 28, 2008

(30) Foreign Application Priority Data

Feb. 28, 2007   (JP) ................................. 2007-048389

(51) Int. Cl.
*G05F 1/575*      (2006.01)
*G05F 1/618*      (2006.01)

(52) U.S. Cl. ........................................ 323/285; 323/284

(58) Field of Classification Search .................. 323/224, 323/282, 284, 285, 351

See application file for complete search history.

(56) References Cited

U.S. PATENT DOCUMENTS

| | | | | |
|---|---|---|---|---|
| 6,674,268 B2 * | 1/2004 | Rutter et al. | ................. | 323/224 |
| 7,031,175 B2 * | 4/2006 | Dequina et al. | ............... | 363/127 |
| 7,166,992 B2 * | 1/2007 | Kudo et al. | ................. | 323/282 |
| 7,202,652 B2 * | 4/2007 | Umemoto et al. | ............ | 323/284 |
| 7,714,558 B2 * | 5/2010 | Wu | .............................. | 323/284 |

FOREIGN PATENT DOCUMENTS

| | | |
|---|---|---|
| JP | 2005-333314 | 12/2005 |
| JP | 2006-502690 | 1/2006 |
| WO | WO2004/034439 | 4/2004 |

* cited by examiner

*Primary Examiner* — Gary L Laxton
(74) *Attorney, Agent, or Firm* — Antonelli, Terry, Stout & Kraus, LLP.

(57) ABSTRACT

A synchronous rectifying drive type semiconductor circuit wherein voltages between drains and sources of power switching elements are detected, temporarily held and compared with a reference voltage. First control signals are generated for turning on the power switching elements depending on comparison result and dead times for the power switching elements are minimized by ORing first control signals and second control signals inputted at input terminals. The first control signals cause the power switching elements to be in "on" state for a constant time until the second control signals as "on" control signals arrive at the input terminals, and then the first control signals as "on" control signals are terminated before the second control signals as "off" signals arrive at the input terminals, thereby swiftly turning off the power switching elements by the second control signals arriving at the input terminals.

9 Claims, 21 Drawing Sheets

SEMICONDUCTOR CIRCUIT

BACKGROUND OF THE INVENTION

This invention relates to a synchronous rectifying drive system wherein current flows through the power switching elements in the reverse direction as well as in the forward direction, and more particularly to a semiconductor circuit capable of performing switching control with low power loss.

In the case of driving an inductive load, there are two modes: the recirculation mode wherein electric energy stored in the inductive load causes electric currents to flow through the power switching elements in the reverse direction and the normal mode wherein electric currents flow through the power switching elements in the forward direction. In the synchronous rectifying drive system, the power switching elements are reversely operated, i.e. turned on in the recirculation mode wherein the reverse voltages are applied to the power switching elements, so that voltage drops across the power switching elements are suppressed as much as possible. However, if the proper instants for synchronous rectifying drive at which the switching elements are turned on are missed, the power switching elements of the upper and lower arms may turn on simultaneously. Accordingly, there arises a possibility that large current flows from the high voltage source terminal to the ground to destroy the power switching elements and sometimes the whole system. Therefore, in order to prevent such a failure, the dead time during which the power switching elements of the upper and lower arms are turned off simultaneously is made sufficiently long enough to prevent the power switching elements from being turned on simultaneously. However, if the dead time is too long, it causes an increase in power loss so that high frequency application is hardly possible. This is a drawback with this system.

JP-A-2005-333314 discloses a method wherein the output voltage of the bridge circuit is detected by a sensor so as to shorten the dead time and the synchronous rectifying drive is effectuated with the voltages applied to the power switching elements.

JP-A-2006-502690 discloses a method wherein the synchronous rectifying drive is effectuated by providing power switching elements having relatively high on-resistances (resistances in the conductive state) in parallel to the main power switching elements.

SUMMARY OF THE INVENTION

In the conventional arts disclosed in JP-A-2005-333314 or JP-A-2006-502690, although there is provided a means of effectuating the synchronous rectifying drive in accordance with the voltage value detected between the drain and the source, of the power switching element to be subjected to synchronous rectifying drive, the countermeasure has not been fully considered against a problem arising from the change in the detected value of the drain-source voltage due to the change in the output voltage caused as a result of synchronous rectifying drive operation.

A semiconductor circuit as an embodiment of this invention which has been made to solve the problem mentioned above, comprises first main terminals; second main terminals; control terminals; power switching elements capable of performing the forward operation wherein main currents flow from the first main terminals to the second main terminals, the cut-off operation wherein main currents are prevented from flowing from the first main terminals to the second main terminals, and the reverse operation wherein main currents flow from the second main terminals to the first main terminals; and driving means operated by the first control signals, which detect the voltages at the first and second main terminals, continue to deliver the "on" control signals for holding the power switching elements in the "on" states for a constant period of time while the detected voltages exceed the reference voltage that satisfies the condition for the synchronous rectifying drive, and thereafter discontinue the "on" control signals. Alternatively, in addition to detecting the voltages at the first and second main terminals of the power switching elements, the rates of changes in the voltages at the first and second main terminals of the power switching elements may be detected to judge the condition for the synchronous rectifying drive.

A semiconductor circuit as another embodiment of this invention, designed to control power switching elements, comprises driving means operated by the second control signals generated on the basis of the signals fed from external circuits using, for example, microcomputers; and driving means operated by the first control signals generated on the basis of the voltage conditions at the output terminals of the power switching elements, i.e. the voltages between the drains and sources of the power switching elements, wherein if the first control signals or the second control signals are the "on" control signals, the power switching elements are turned on.

A semiconductor circuit as still another embodiment of this invention, comprises driving means operated by the second control signals to control power switching elements; and control means operated by the first control signals, wherein the power switching elements are normally controlled by the second control signals, and the power switching elements are turned on only when there is an interruption by the "on" control signals based on the first control signals.

A semiconductor circuit as yet another embodiment of this invention is characterized in that the voltages at the first and second main terminals are detected; the periods of the first control signals during which the power switching elements are held in the "on" states when the voltages at the first and second main terminals exceed the reference voltage, are set longer than the minimum length of time in which the second control signals can be varied.

Also, in a semiconductor circuit according to this invention, two power switching elements are used as an upper arm power switching element and a lower arm power switching element provided between a high voltage terminal and a reference voltage terminal; a load is connected with the terminal between the upper arm power switching element and the lower arm power switching element; and a dead time is provided between the second control signal for the upper arm power switching element and the second control signal for the lower arm power switching element, so as to prevent the upper arm power switching element and the lower arm power switching element from being turned on simultaneously in the normal drive mode.

Further, in a semiconductor circuit according to this invention, the periods of the first control signals for the upper and lower arm power switching elements during which the power switching elements are held in the "on" states are set longer than the time equal to the dead time minus the transition period of the output voltage.

Still further, in a semiconductor circuit according to this invention, the voltages between the drains and sources of the power switching elements are detected to continue the normal synchronous rectifying drive operation even after the output voltage has changed as a result of the initiation of the synchronous rectifying drive; the first control signals are generated when the detected voltages turn to have reverse polarity, the first control signals then turning on the power switching elements; the "on" states of the power switching elements are held for a certain period of time even after the voltages between the drains and sources of the power switching elements ceased to satisfy the condition for the synchronous rectifying drive operation as a result of the initiation of the synchronous rectifying drive operation; and the "on" states of the power switching elements are continued until the arrival of the second control signals that are the signals for performing the synchronous rectifying drive of the power switching elements.

Yet further, in a semiconductor circuit according to this invention, the periods of the first control signals during which the power switching elements are held in the "on" drive states, are terminated before the arrival of the second control signals for performing the "off" drive of the power switching elements, so as to swiftly perform the "off" drive of the power switching elements when the second control signals for performing the "off" drive of the power switching elements arrive next time.

A semiconductor circuit according to this invention, comprises driving means operated by the second control signals for controlling the power switching elements; and driving means operated by the first control signals, wherein the power switching elements are turned on when the first control signals or the second control signals are the "on" drive signals.

In a semiconductor circuit according to this invention, the dead time can be shortened to its minimal limit while preventing an erroneous operation that may be caused as a result of the synchronous rectifying drive. Accordingly, the resulted bridge circuit can be applied to high frequency, low loss operations.

In a semiconductor circuit according to this invention, since free wheel diodes can be dispensed with, the reduction of size and cost will also be possible.

Other objects, features and advantages of the invention will become apparent from the following description of the embodiments of the invention taken in conjunction with the accompanying drawings.

DETAILED DESCRIPTION OF THE EMBODIMENTS

The embodiments of this invention will now be described with reference to the attached drawings.

Embodiment 1

Figure 1:
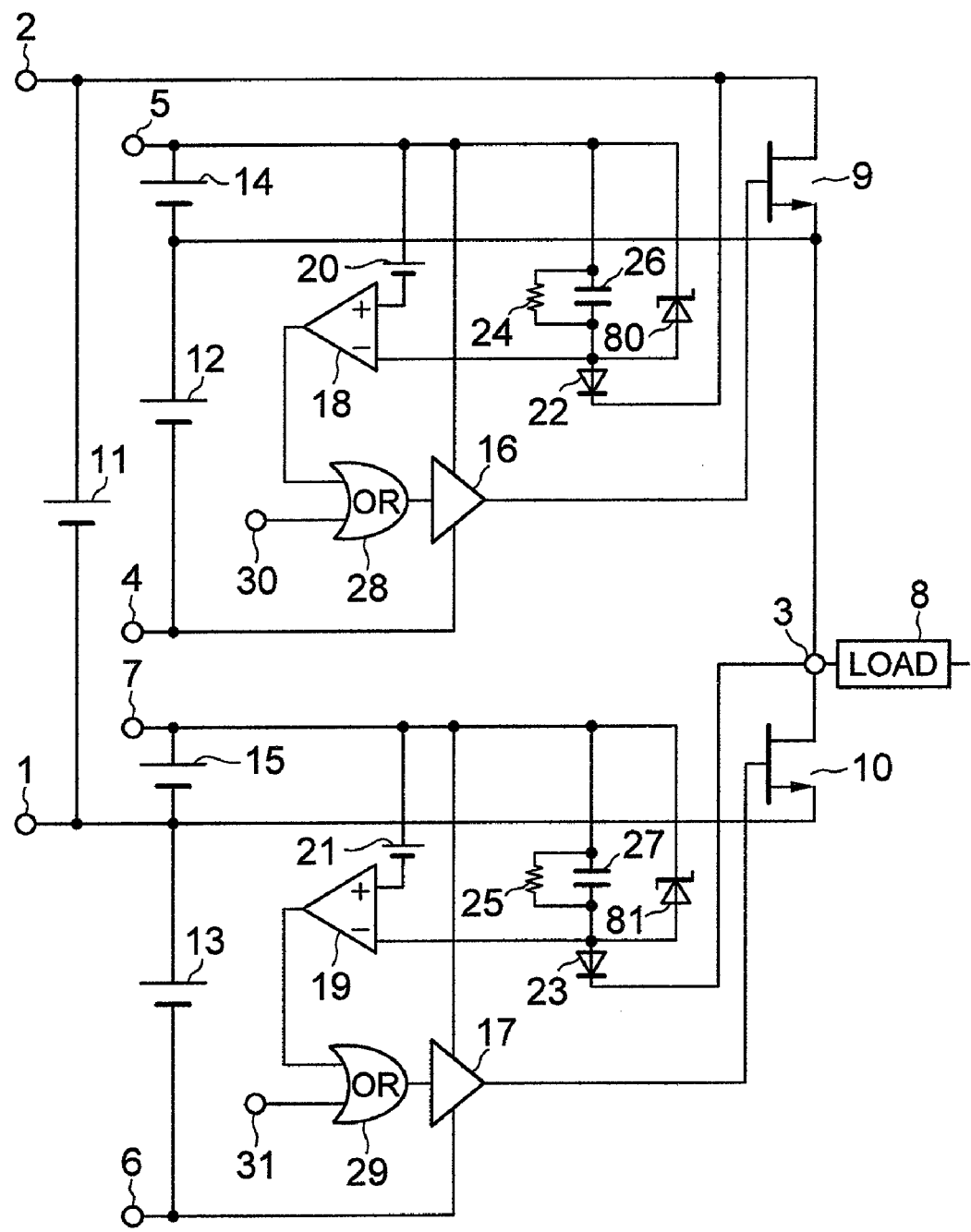
FIG. 1 shows a semiconductor circuit as a first embodiment of this invention.
Figure 2:
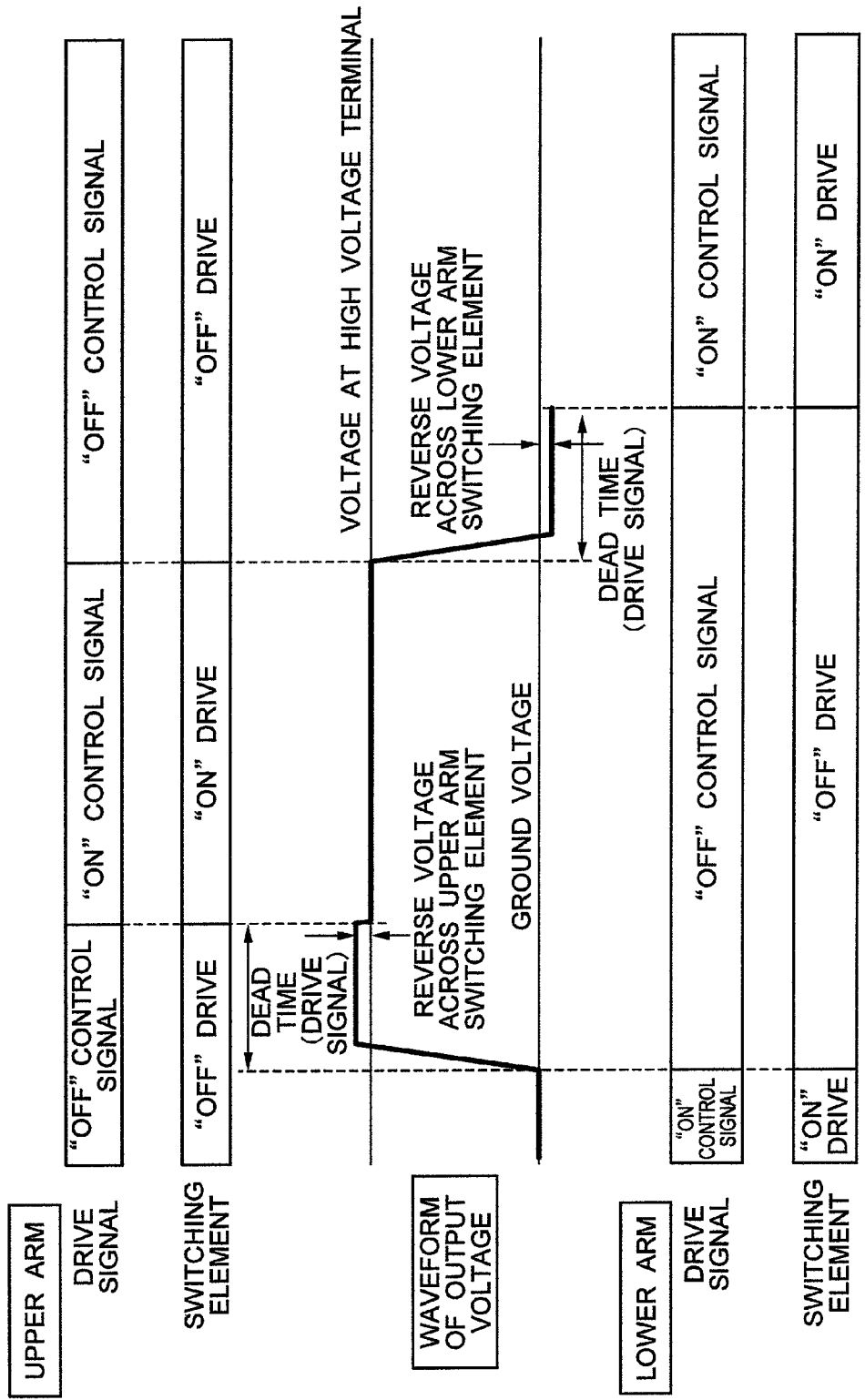
FIG. 2 shows a diagram for illustrating how an example of the conventional synchronous rectifying drive system operates.
Figure 3:
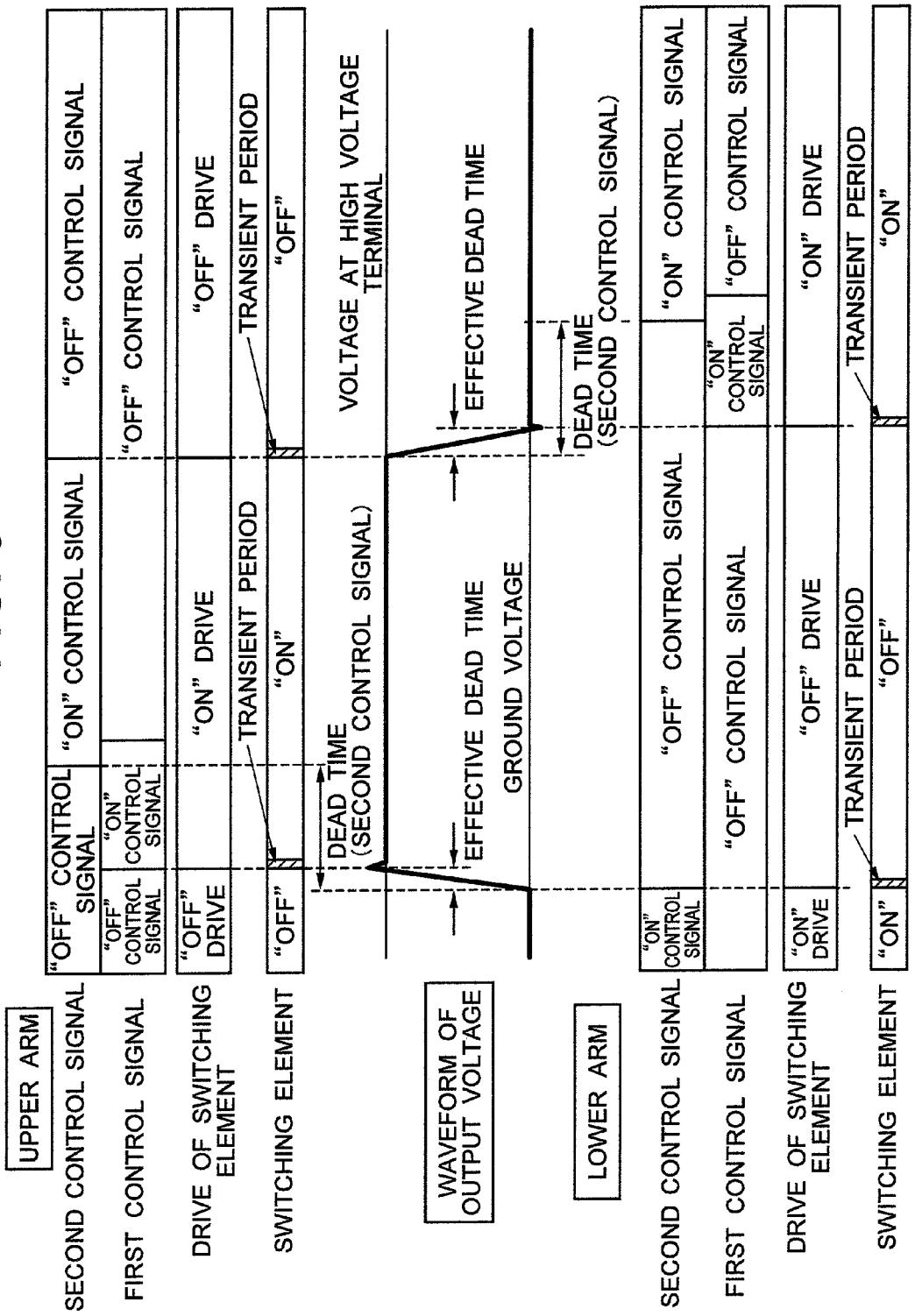
FIG. 3 shows a diagram for illustrating how the semiconductor circuit shown in FIG. 1 operates.

FIG. 1 shows a semiconductor circuit as a first embodiment of this invention, FIG. 2 shows a diagram for illustrating how an example of the conventional drive system operates, and FIG. 3 shows a diagram for illustrating how the semiconductor circuit shown in FIG. 1 operates. This embodiment is described below on the assumption that the drive period is long, the inductive energy stored in the load while the "on" pulse is being applied is released, and no backflow current exists at the end of the "on" pulse. It is also assumed in the following description that the power switching element 9 of the upper arm and the power switching element 10 of the lower arm are n-channel JFETs (junction type field effect transistors) in most cases. However, this assumption does not mean the exclusion of the use of other power switching elements such as power MOSFETs or bipolar transistors in place of the JFETs.

The semiconductor circuit shown in FIG. 1 has a ground terminal 1, the high voltage terminal 2 of a high voltage power source 11, power sources 12, 13 for the control circuits, positive voltage terminals 5, 7 of the control circuits, and negative voltage terminals 4, 6 of the control circuits. A load 8 is connected with the output terminal 3. This load 8 is normally an inductive load such as an electric motor or the LC filter of a DC/DC converter.

In FIG. 2 is shown an example of the conventional synchronous rectifying drive method wherein an inductive load is driven by using power MOSFETs serving as power switching elements. A dead time of about several microseconds is introduced to prevent the switching elements of the upper and lower arms from being turned on simultaneously. When the lower arm power MOSFET is turned off, the voltage at the output terminal rises due to the energy stored in the inductive load even while the upper arm power MOSFET is cut off. Accordingly, a reverse voltage is applied to the upper arm power MOSFET so that the parasitic diode between the drain and source of the upper arm power MOSFET is turned on. As a result, the voltage at the output terminal becomes higher by about one volt than the voltage at the high voltage terminal during the dead time. Now, when the upper arm power MOSFET is turned on, the difference between the voltage at the output terminal and the voltage at the high voltage terminal may be reduced to the voltage developed across the upper arm power MOSFET when it is conductive. Then, when the upper arm power MOSFET is turned off, the energy stored in the inductive load causes the voltage at the output terminal to rise even while the lower arm power MOSFET is cut off. Accordingly, a reverse voltage is applied to the lower arm power MOSFET so that the parasitic diode between the drain and source of the lower arm power MOSFET is turned on. As a result, the voltage at the output terminal becomes lower by about one volt than the ground voltage during the dead time. Now, when the lower arm power MOSFET is turned on, the difference between the voltage at the output terminal and the ground voltage may be reduced to the voltage developed across the lower arm power MOSFET when it is conductive. Namely, indeed the synchronous rectifying drive performed by using power switching elements with low power loss can reduce the loss incurred when reverse currents flow through the power switching elements, but this drive method cannot be free from the problem that the effect of enjoying low loss in the synchronous rectifying drive is diminished when operating frequency becomes high to increase the proportion of the dead time.

Further, when the power MOSFETs in the above description are replaced by the JFETs, the above mentioned reverse voltage becomes equal to the threshold voltage at which the JFETs are operated in the reverse direction. Namely, the reverse voltage becomes high, i.e. several to several tens of volts, whereby a long dead time leads to a very large loss. To cope with this drawback, a free wheel diode needs to be connected between the drain and source terminals of each JFET. However, there is still a problem that for high voltage and high frequency applications, such a free wheel diode must be an expensive Schottky diode made of SiC that has a small minority carrier accumulation effect or GaN that is wide band-gap semiconductor.

In this embodiment, in order to make the dead time as short as possible, whether or not the power switching elements are reversely biased are determined by using the reference voltages 20, 21 applied to the positive input terminals of the comparator circuits 18, 19. Namely, in the normal operation mode, since the high voltage diodes 22, 23 are reversely biased, the negative input terminals of the comparator circuits 18, 19 are supplied with the voltage Vp equal to the voltage at the terminal 5 to which the reference voltage Vref is coupled while the positive input terminals of the comparator circuits 18, 19 are supplied with the voltage (Vp−Vref). However, when the operation approaches the recirculation operation mode or the recirculation mode, the high voltage diodes 22, 23 are forwardly biased, the negative input terminals of the comparator circuits 18, 19 are supplied with the voltage (Vf+Vds) while the positive input terminals of the comparator circuits 18, 19 are supplied with the voltage (Vp−Vref). Here, Vf indicates the voltage of the reference voltage sources 20, 21, Vp the voltage of the positive voltage sources 14, 15 for the control circuits, Vds the voltages developed between the drains and sources of the power switching elements 9, 10, and Vf the forward voltages across the high voltage diodes 22, 23.

In the normal operation mode wherein the voltages Vp and (Vp−Vref) are applied respectively to the negative and positive input terminals of the comparator circuits 18, 19, the output voltages of the comparator circuits 18, 19 (defined as the first control signal) become low. On the other hand, when the voltages between the drains and sources of the power switching elements 9, 10 becomes negative, that is, when the voltages (Vf+Vds) at the negative input terminals of the comparator circuits 18, 19 becomes lower than the voltage (Vp−Vref) at the positive input terminals of the comparator circuits 18, 19, the output voltages of the comparator circuits 18, 19 (defined as the first control signal) become high, thereby being able to turn on the power switching elements 9, 10.

The condition that the power switching elements 9, 10 are turned on depending on the voltages between the drains and sources of the power switching elements 9, 10 in response to the outputs of the comparator circuits 18, 19, is hereafter referred to as the synchronous rectifying drive condition established due to the first control signals. On the other hand, the second control signals generated on the basis of a signal from the external control circuit using a microcomputer etc. are applied to the input terminals 30, 31. Thus, the first control signals and the second control signals are fed as inputs to the OR circuits 28, 29. Consequently, if the first control signals are the "on" control signals, the drive circuits 16, 17 turn on the power switching elements 9, 10 regardless of whether the second control signals are the "on" control signals or the "off" control signals. Therefore, as shown in FIG. 3, the power switching elements 9, 10 are turned on in such a manner that the synchronous rectifying drive can be performed with the optimal dead time that is shorter than the dead time determined depending on the second control signals. FIG. 3 shows a diagram for illustrating how the semiconductor circuit according to this embodiment operates. Since the transient periods during which the power switching elements shift from their conductive to cut-off states are set sufficiently shorter than the transient time of the output voltage by swiftly driving the power switching elements with their gate voltages, the upper and lower arm power switching elements can be prevented from being turned on simultaneously.

Further, in this embodiment, state holding circuits consisting of resistors 24, 25 and capacitors 26, 27 are provided to hold the "on" states of the power switching elements initiated by the first control signals for a constant period of time. During the constant period, the high voltage diodes 22, 23 develop high impedances so that the held states can be easily continued. Without these state holding circuits, the power switching elements 9, 10 would be turned on by the first control signals before the arrival of the "on" control signals for performing the synchronous rectifying drive in response to the second control signals. The consequent fall of the drain-source voltages of the power switching elements would possibly cause the power switching elements to turn off again on the basis of an erroneous decision by the comparator circuits 18, 19 that the synchronous rectifying drive is not necessary. With these state holding circuits added, however, the first control signals can cause the "on" control signals to last until the second control signals cause the "on" control signals to be delivered. As a result, a stable synchronous rectifying drive operation can be effected. If the second control signals cause the "on" signals to be delivered too long, the power switching elements become unable to be turned off. Therefore, the state holding circuits are provided with resistors 24, 25 so as to discontinue the "on" signals and deliver the "off" signals, after the lapse of a fixed length of time. These resistors help finish the "on" operations initiated due to the first control signals after the power switching elements have been turned on due to the second control signals after the end of the dead time period. Thus, this constitution has an advantage that the power switching elements can be quickly turned off when the second control signals cause the "off" control signals to be delivered.

The condition for the synchronous rectifying drive due to the first control signals may be determined depending on not only the comparisons of voltages by the comparator circuits 18, 19 but also the combination of such voltage comparisons and the rates of changes in the drain-source voltages of the power switching elements 9, 10. If the condition for the synchronous rectifying drive is determined depending on not only the comparisons of voltages by the comparator circuits 18, 19 but also the combination of such voltage comparisons and the changes in the drain-source voltages of the power switching elements 9, 10, then the synchronous rectifying drive can be effected with minimum delay in timing with the instant that the power switching elements 9, 10 are reversely biased, so that the incurred loss can be reduced. In this embodiment, the condition for the synchronous rectifying drive can be determined by including also the rate of change in the drain-source voltages of the power switching elements adjusted by changing the capacitances of the capacitors 24, 25. Namely, if the capacitances of the capacitors 24, 25 are reduced to increase the rate of change in the drain-source voltages of the power switching elements 9, 10, the condition for the synchronous rectifying drive can be established even though the reverse bias voltages across the drains and sources of the power switching elements 9, 10 are relatively low. Moreover, it is possible by appropriate circuit design that the synchronous rectifying drive condition can be established immediately before the drain-source voltages become reverse biases. In the case where the synchronous rectifying drive condition is established immediately before the drain-source voltages become reverse biases, since there is a measurable delay between the instant of the detection of the established synchronous rectifying drive condition and the instant of turning on the power switching elements 9, 10, then by far optimal synchronous rectifying drive can be performed. Moreover, by turning off the power switching elements 9, 10 on the side of the reverse arm at high speeds, the upper and lower arms can be prevented from being turned on simultaneously.

In this embodiment, PN junction diodes having a small current capacity can be used for the high voltage diodes 22, 23. If Schottky diodes having small current capacities or PN junction diodes made of wide band-gap semiconductor are used for the same purpose, a still further reduction of incurred loss can be enjoyed as the effect of the minor carrier accumulation can be neglected. Moreover, since the high voltage diodes 22, 23 do not serve as freewheel diodes through which heavy currents flow, they can be silicon PN junction diodes which have smaller current capacities than the power switching elements 9, 10. In such a case, the recovery loss in the diodes will also be small. When diodes of wide band-gap semiconductor which hardly accumulates minority carriers are employed, they can be of small size with relatively low cost. Furthermore, in this embodiment, although a small number of additional parts are needed as necessary external circuit elements, they do not contribute to the increase in cost as they can be formed through an integrated circuit technique in the same chip as incorporates therein the originally necessary gate drive circuits.

The state holding circuits mentioned above may be sample/hold circuits, or timer circuits if the state holding time should be of high accuracy. The state holding time is influenced by the accuracy and the tolerance of delays in the second control signals or the operations of the gate drive circuits. When the switching frequencies of the power switching elements 9, 10 are, for example, about 100 kHz, it is appropriate to set the value of the state holding time in the range of 100-500 ns. Zener diodes 80, 81 are provided to prevent excessive positive or negative voltages from being applied to the input terminals of the comparator circuits. If there is no possibility that excessive positive or negative voltages are applied to the input terminals of the comparator circuits, they can be dispensed with.

Each of the zener diodes 80, 81 can be replaced by not less than two zener diodes connected in series. In such a case, the value of above mentioned Vf will be the sum of the Vf's of the series-connected diodes.

The capacitors 26, 27 of the state holding circuits also serve to mitigate the noise entering the comparator circuits 18, 19.

Embodiment 2

Figure 4:
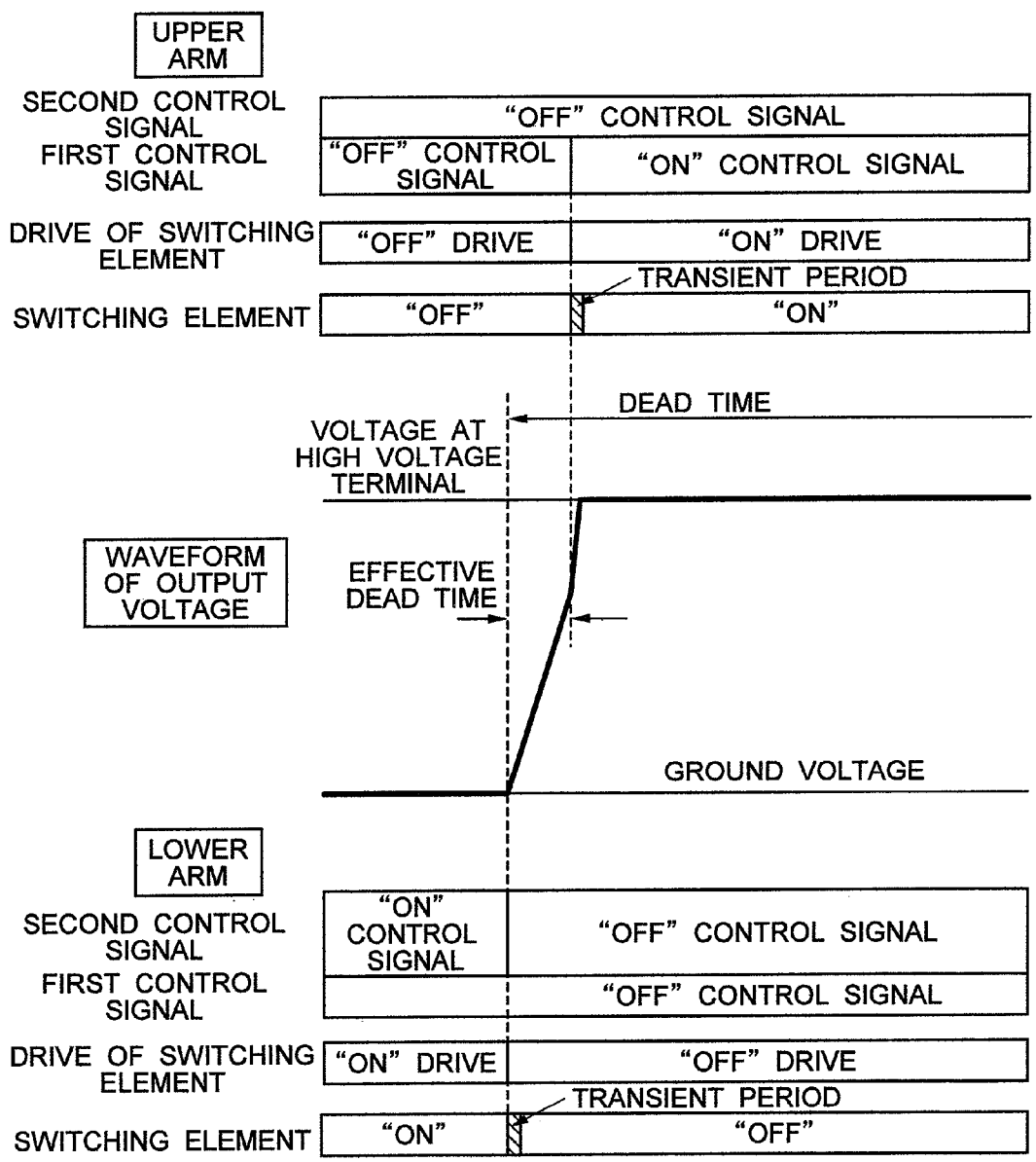
FIG. 4 shows a diagram for illustrating how a semiconductor circuit as a second embodiment of this invention operates (when the output voltage rises)
Figure 5:
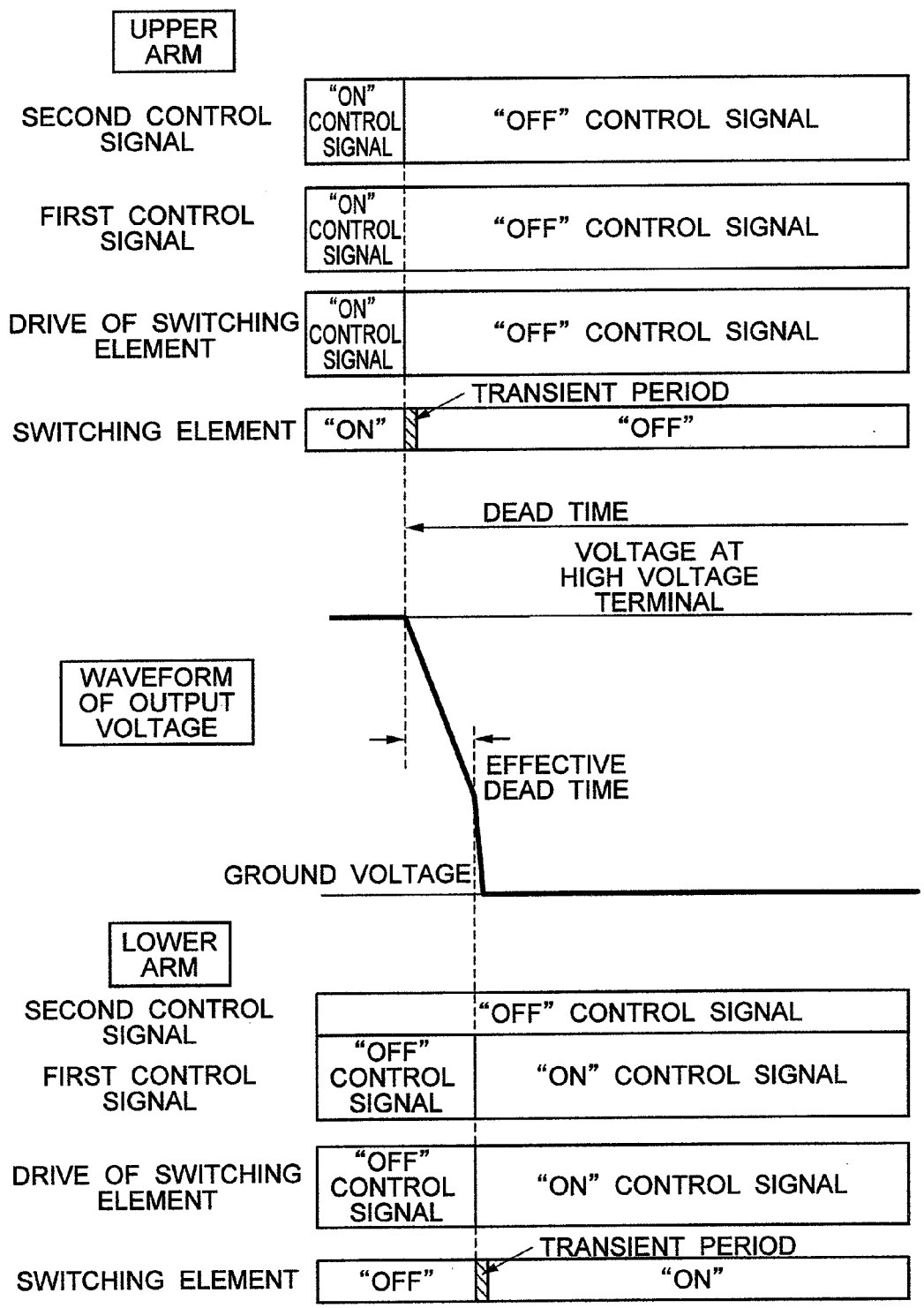
FIG. 5 shows a diagram for illustrating how a semiconductor circuit as a second embodiment of this invention operates (when the output voltage falls)

FIGS. 4 and 5 show diagrams for illustrating how a semiconductor circuit as the second embodiment of this invention operates when the output voltage rises and falls, respectively. The semiconductor circuit as this second embodiment is the same as the semiconductor circuit shown as the first embodiment in FIG. 1, but characterized in that the synchronous rectifying drive is initiated before the end of the switching period. It is therefore possible to eliminate the period during which the voltage at the output terminal 3 rises far above the voltage of the high voltage source and falls far below the ground voltage, after the end of switching. This way of driving can be effected by suitably choosing the values of the reference voltages 20, 21 applied to the positive terminals of the comparators 18, 19. Alternatively, the same way of driving can be realized, as described above in the first embodiment, by determining the condition for the synchronous rectifying drive due to the first control signals depending on not only the comparisons of voltages by the comparator circuits 18, 19 but also the combination of such voltage comparisons and the rates of changes in the drain-source voltages of the power switching elements 9, 10.

According to this second embodiment, the synchronous rectifying drive is initiated in the switching period during which the voltage at the output terminal makes transition. Thus, the power switching element to be turned off is shifted from its "on" state to "off" state before or in the initial stage of the transition of the voltage at the output terminal by swiftly and securely controlling the voltage at the controlling terminal (gate terminal or base terminal) of the power switching element to be turned off to a low level. Consequently, the power switching elements of the upper and lower arms can be prevented from being turned on simultaneously. The condition for control in this way can be realized by optimizing the values of Vref, Vp and Vf in the circuit shown in FIG. 1, including, for example, the provision of not less than two zener diodes connected in series in place of each of the zener diodes 80, 81.

Embodiment 3

Figure 6:
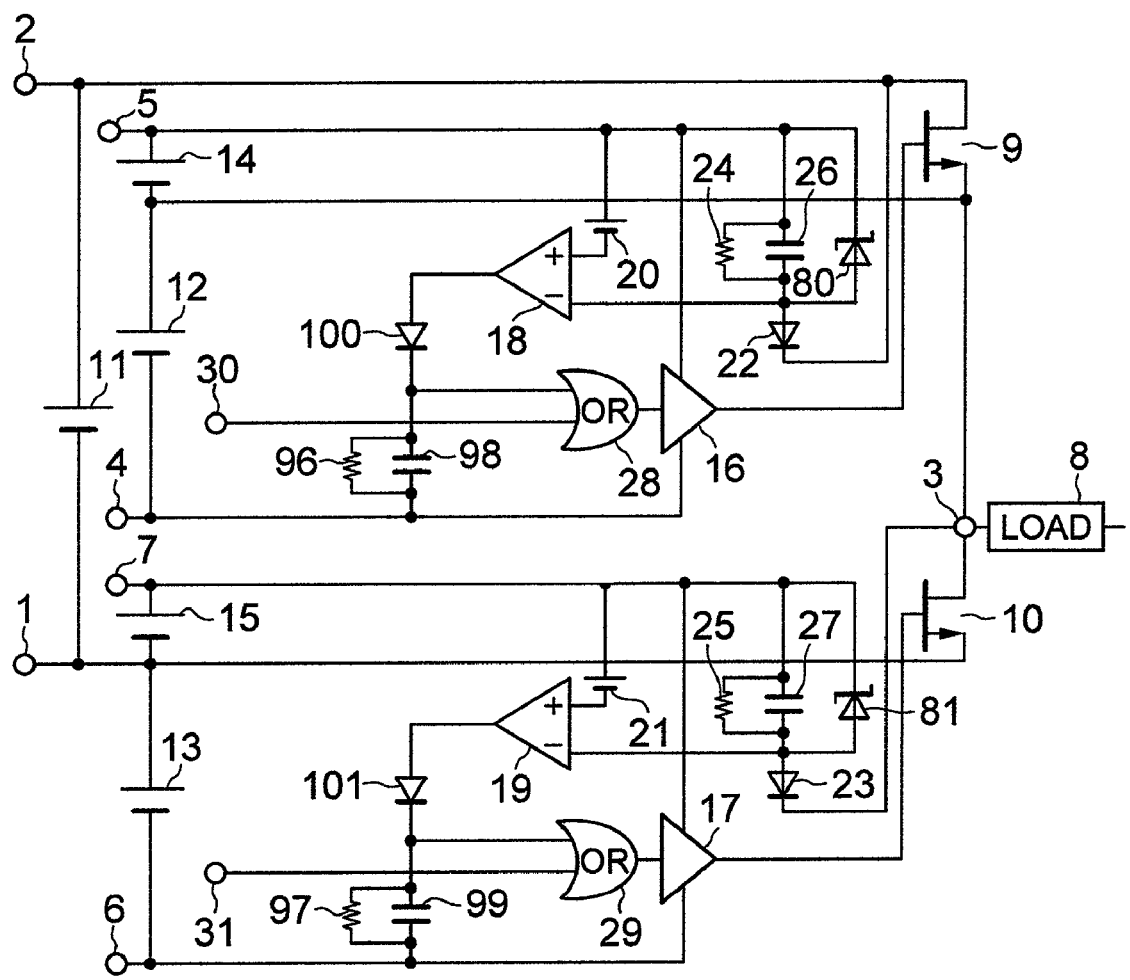
FIG. 6 shows a semiconductor circuit as a third embodiment of this invention.

FIG. 6 shows a semiconductor circuit as a third embodiment of this invention. In this embodiment, state holding circuits are provided after the output terminals of the comparator 18, 19 to fulfill the intended purpose. Namely, diodes 100, 101, resistors 96, 97, and capacitors 98, 99 constitute the state holding circuits. The state holding circuits provided before the negative terminals of the comparator circuits 18, 19 as shown in the first embodiment in FIG. 1 are also employed in this embodiment so as to enhance the precision in the operation of the state holding circuits. However, one of the state holding circuits provided before and after each comparator circuit may be dispensed with.

This embodiment can enjoy the same advantage as the first embodiment can.

Embodiment 4

Figure 7:
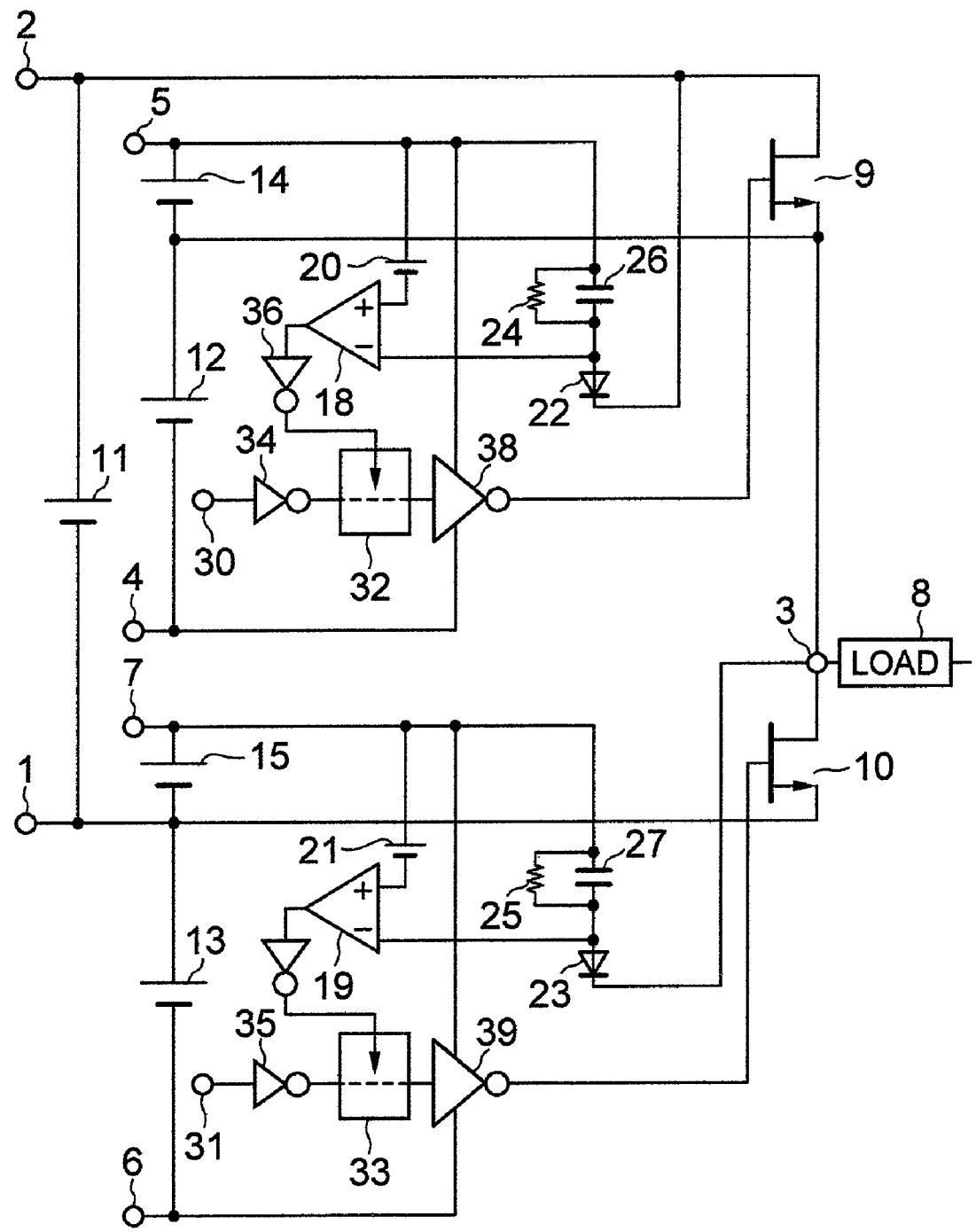
FIG. 7 shows a semiconductor circuit as a fourth embodiment of this invention.

FIG. 7 shows a semiconductor circuit as a fourth embodiment of this invention. In this embodiment, the OR circuits 28, 29 shown in the first embodiment in FIG. 1 is replaced by interrupting circuits 32, 33, and the drive circuits 16, 17 shown in FIG. 1 are replaced by inverting drive circuits 38, 39 for equivalently driving the gates of the power switching elements. Also, circuits 36, 37 and 34, 35 are drive circuits of inverter type for inverting the second control signals. The interrupting circuits 32, 33 are provided to prioritize the first control signals for synchronous rectifying drive with respect to the second control signals.

In this embodiment, the interrupting circuits 32, 33 are shown as provided before the gate drive circuits 38, 39, but they may be located in any other suitable place so that the interruption signals may be inserted in or after the gate drive circuits 38, 39.

Also in this embodiment, the functions of holding states for a certain period of time are the same as in the first embodiment. Thus, this embodiment can enjoy the same advantage as the embodiments described above can.

Embodiment 5

Figure 8:
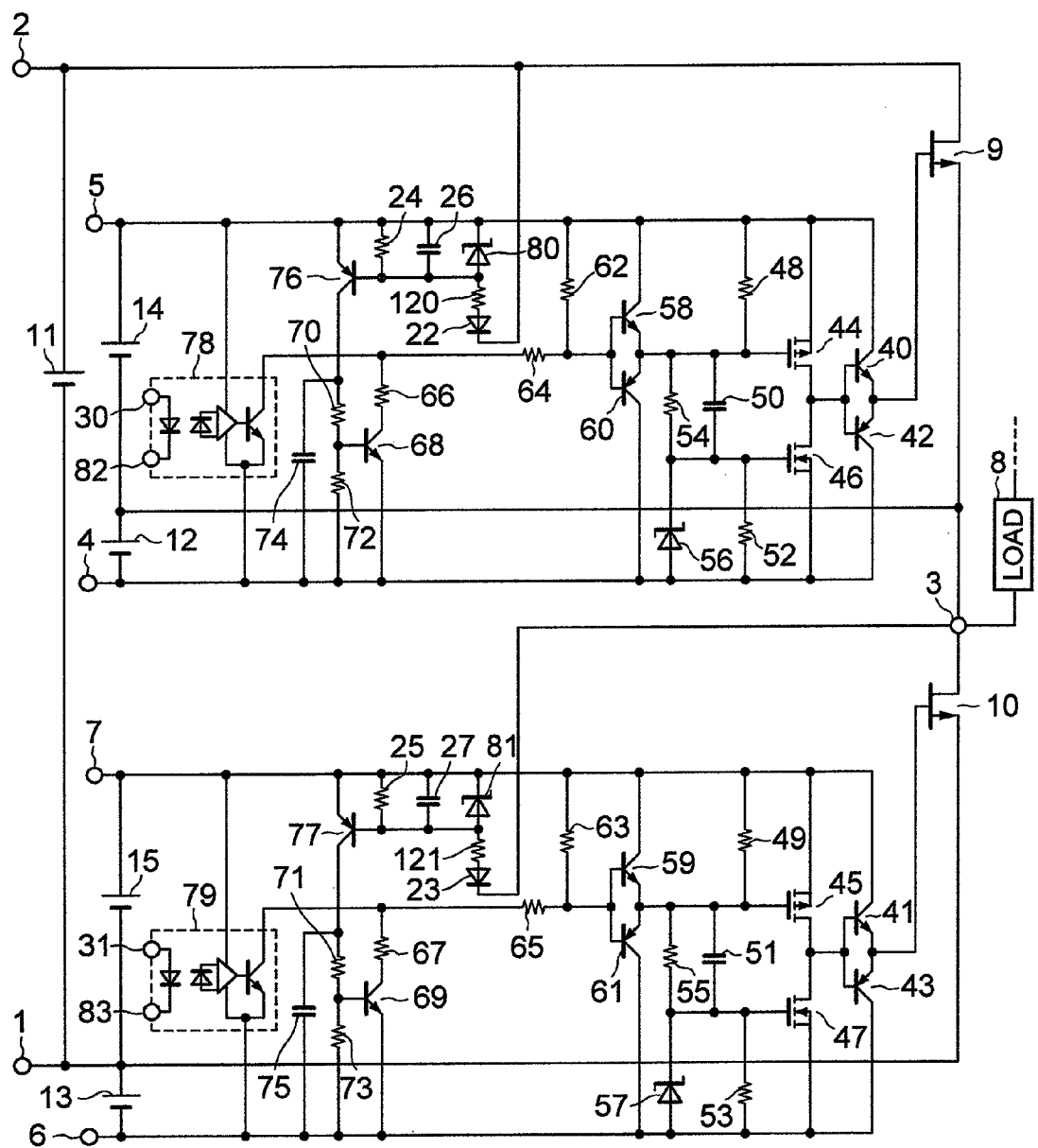
FIG. 8 shows a semiconductor circuit as a fifth embodiment of this invention.

FIG. 8 shows a semiconductor circuit as a fifth embodiment of this invention. In FIG. 8, the block diagram shown in FIG. 7 is replaced by a concrete, detailed circuit of practical example. Transistors 58-61, and 40-43, MOSFETs 44-47, and resistors 48, 49, 52, 53 serve altogether as the drive circuits 38, 29 of inverter type shown in FIG. 7. In this embodiment, the amplitudes of the gate drive voltages are enhanced by level shifters consisting of capacitors 50, 51 and zener diodes 56, 57 so as to drive JFETs 9, 10 at high speeds. The resistors 48, 49, 52, 53 are provided to turn off the MOSFETs 44-47 unless they receive gating signals while the resistors 54, 55 are provided to release the electric charges accumulated in the capacitors 50, 51 when the operations of the gate drive circuits stop. Photo-couplers 78, 79 correspond to the inverter circuits 34, 35 in FIG. 7. Transistors 76, 77 work as the comparator circuits 18, 19 in FIG. 7. The forward voltages between the bases and emitters of the transistors 76, 77 correspond to the reference voltages 20, 21 in FIG. 7. Transistors 68, 69 correspond to the inverter circuits 36, 37 in FIG. 7. In this embodiment, when the reverse voltages are applied between the drains and sources of the JFETs 9, 10, the transistors 68, 69 are turned on, regardless of the outputs of the photo-couplers 78, 79 serving as the second control signals, so as to generate the first control signals to turn on the JFETs 9, 10. Resistors 62-65 and their associated wiring leads constitute circuits equivalent to the interrupting circuits 32, 33 in FIG. 7. Or from a different view, it is considered that transistors 58-61 constitute wired OR circuits (corresponding to the OR functions 28, 29 in FIG. 1) and therefore the power switching elements 9, 10 are turned on when the first control signals or the second control signals produce the "on" drive states.

The voltages of positive voltage sources 14, 15 are about 2.5-5 volts when SiC JFETs of normally "off" type are used for the power switching elements 9, 10, but may be 0 (zero) volt when SiC JFETs of normally "on" type are used for the power switching elements 9, 10. Alternatively, in order to facilitate the arbitrary determination of the voltage at the output terminal in the synchronous rectifying drive, power source voltages may be separately utilized such that the state holding circuits and the comparator circuits are connected with the terminals 5, 7 of the positive voltage sources 14, 15 while the other circuits are connected with the reference voltage terminal 1 and the output terminal 3.

Resistors 120, 121 are provided to avoid excessive loss incurred when the reverse voltages are applied to the JFETs 9, 10 to cause excessive forward biases to be applied between the bases and emitters of the transistors 76, 77 and across the high voltage diodes 22, 23.

With the circuit configuration as the fifth embodiment described above, such a function as attained by the circuit shown in FIG. 6 can be realized, and this embodiment can also enjoy the same advantage as the first or second embodiment can.

Embodiment 6

Figure 9:
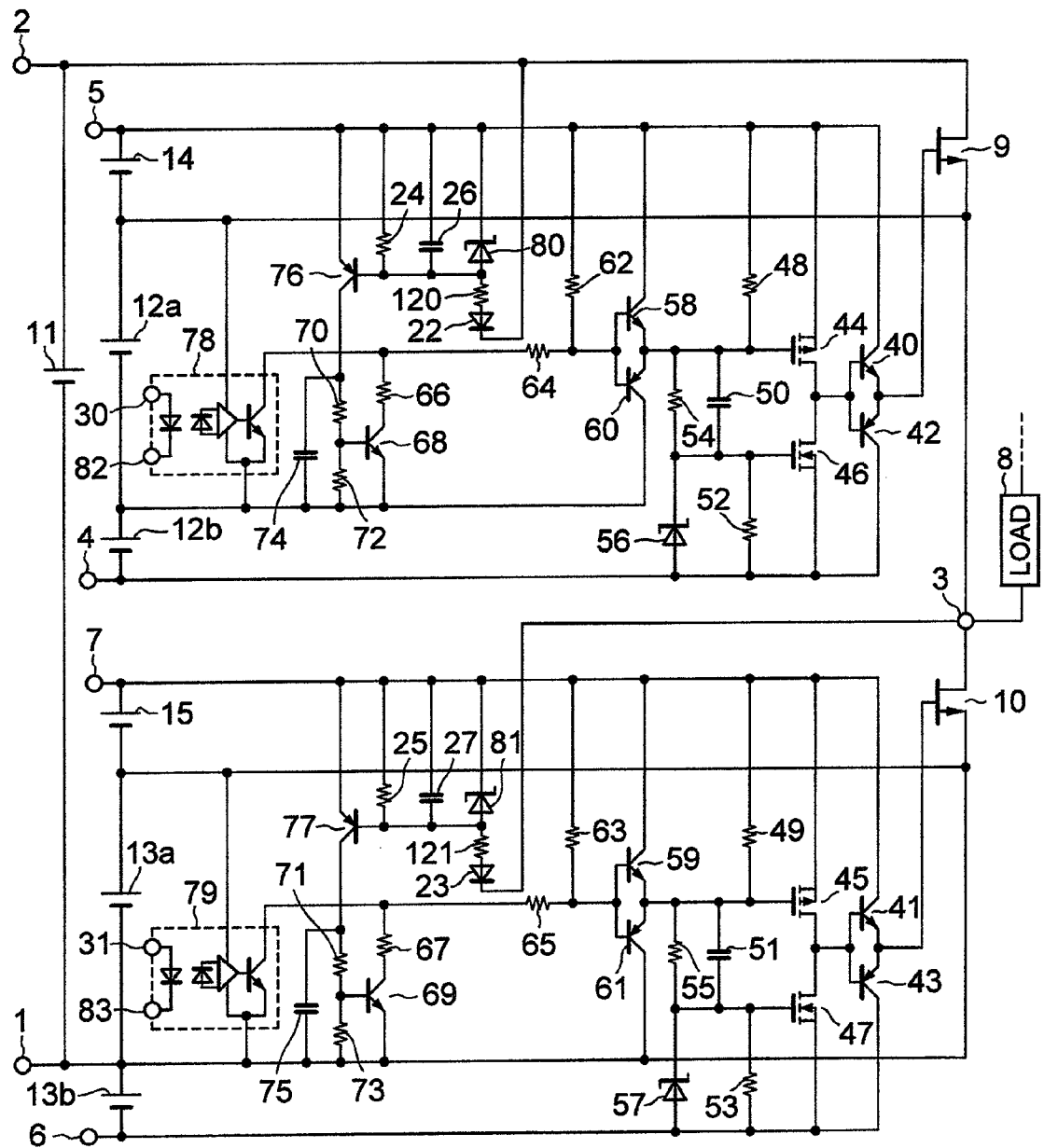
FIG. 9 shows a semiconductor circuit as a sixth embodiment of this invention.

FIG. 9 shows a semiconductor circuit as a sixth embodiment of this invention. This embodiment is characterized in that the negative voltage power sources 12, 13 for the control circuits shown in FIG. 8 are split into power sources 12a, 12b, 13a and 13b, respectively. The rest of the circuit configuration is the same as the semiconductor circuit shown in FIG. 8. This embodiment has the advantage that the optimization of the value of the reverse voltage at which the synchronous rectifying drive is initiated can be facilitated by increasing the number of power sources for the control circuits.

With this circuit configuration, too, the same advantages can be obtained as with the first or second embodiment described above.

Embodiment 7

Figure 10:
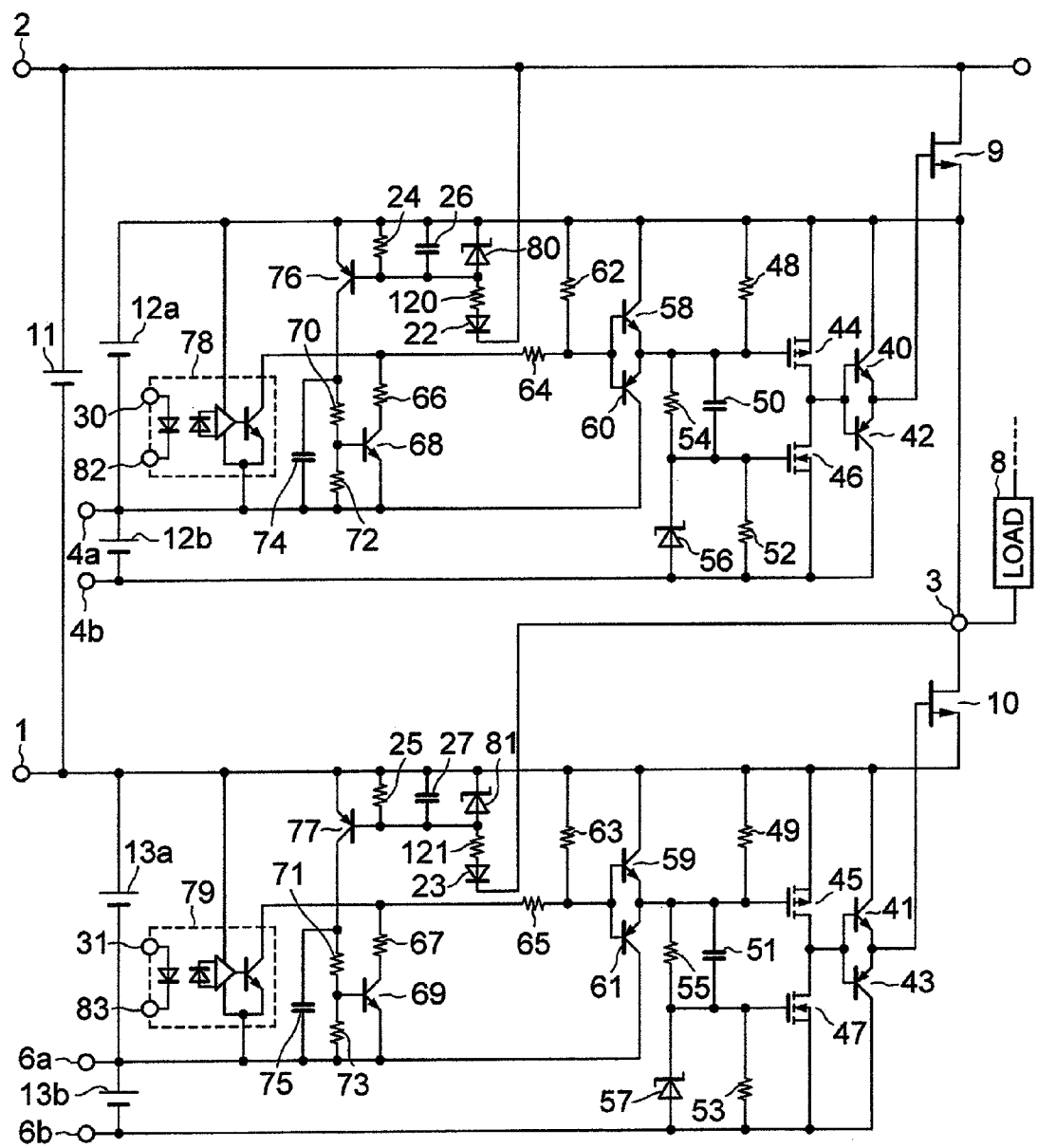
FIG. 10 shows a semiconductor circuit as a seventh embodiment of this invention.

FIG. 10 shows a semiconductor circuit as a seventh embodiment of this invention. In this embodiment, the power switching elements 9, 10 are of "normally on" type. Accordingly, the positive power sources 14, 15 shown in FIG. 9 are dispensed with, the overall configuration being simplified. However, in order to optimize the condition for performing synchronous rectifying drive even when the power switching elements 9, 10 are of "normally on" type, the provision of the positive power sources 14, 15 as shown in the first through sixth embodiments can facilitate the design of the intended circuit.

With this circuit configuration, too, the effective dead time can be shortened just as in the first embodiment described above.

Embodiment 8

Figure 11:
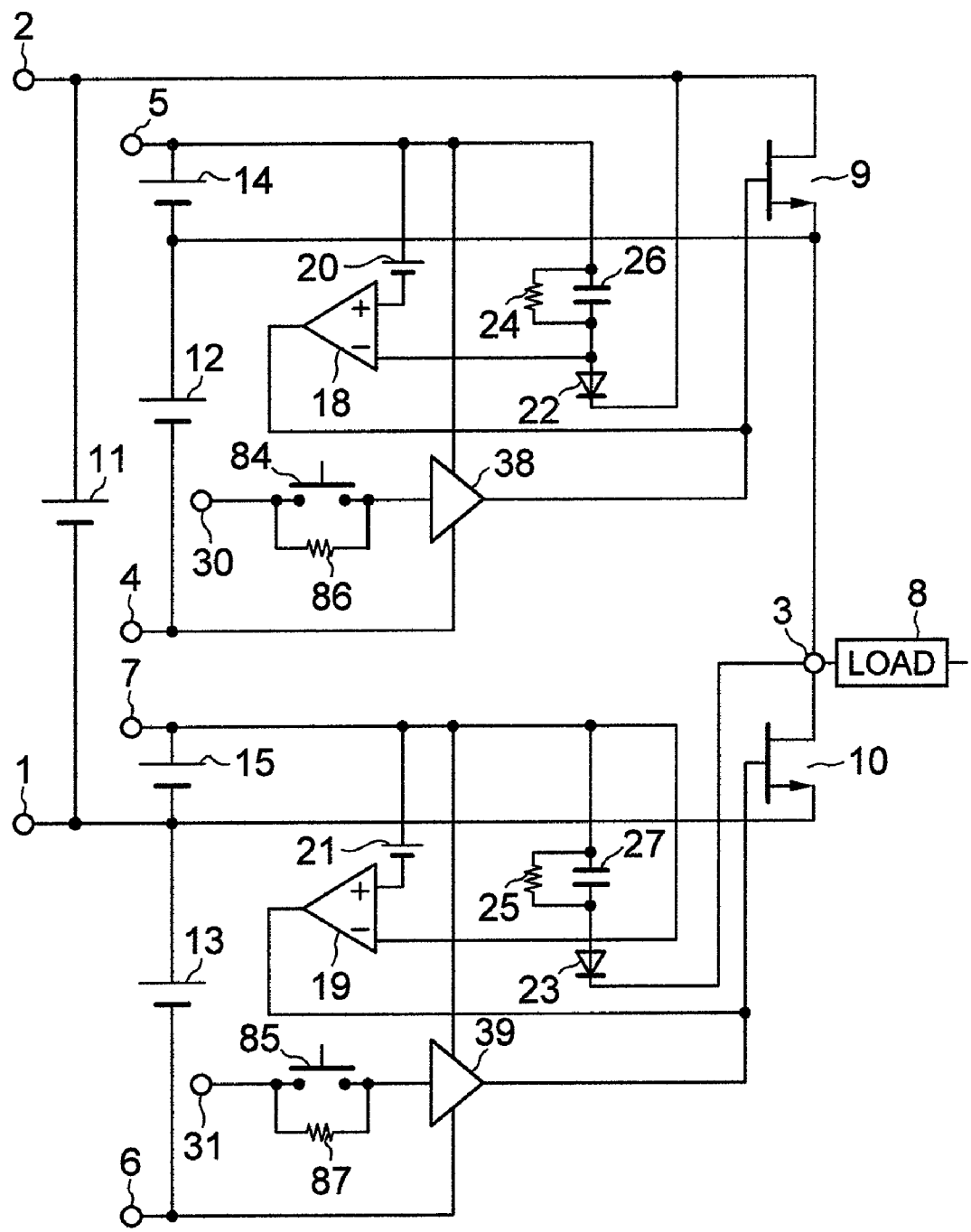
FIG. 11 shows a semiconductor circuit as an eighth embodiment of this invention.

FIG. 11 shows a semiconductor circuit as an eighth embodiment of this invention. This embodiment is different from the first embodiment shown in FIG. 1 in that the OR circuits 28, 29 are replaced by functional circuits consisting of switching circuits 84, 85 and high-resistance resistors 86, 87 connected in parallel, the functional circuits being provided on the sides of the input terminals 30, 31 serving as the second control signal terminals. In this embodiment, the switching circuits 84, 85 are cut off only for the period during which the input terminals 30, 31 serving as the second control signal terminals are kept at low voltages, that is, the input terminals hold the "off" signals, so that the input terminals of the non-inverting drive circuits 16, 17 are kept at low voltages as a result of voltage drops across the high-resistance resistors 86, 87. When reverse voltages are or are ready to be, applied between the drains and sources of the power switching elements, the outputs of the comparator circuits 18, 19 become high voltages so that the power switching elements are turned on with the result that the synchronous rectifying drive is initiated. In this case, due to the high-resistance resistors 86, 87, excessive currents can be prevented from flowing from the output terminals of the comparator circuits 18, 19 toward the input terminals 30, 31. The second control signals at the input terminals 30, 31 are inputted into the non-inverting drive circuits 38, 39 in the "on" states of the switching circuits 84, 85. Accordingly, high voltage signals are applied to the gates of the power switching elements even after the input condition of the comparator circuits 18, 19 that the outputs of the comparator circuits 18, 19 become low voltages. Here, the circuit configuration is such that excessive currents do not flow toward the output sides of the comparator circuits 18, 19 as high voltages are then applied to the output terminals of the comparator circuits 18, 19 at this condition.

With this circuit configuration, too, the same advantages can be obtained as with the first or second embodiment described above.

Embodiment 9

Figure 12:
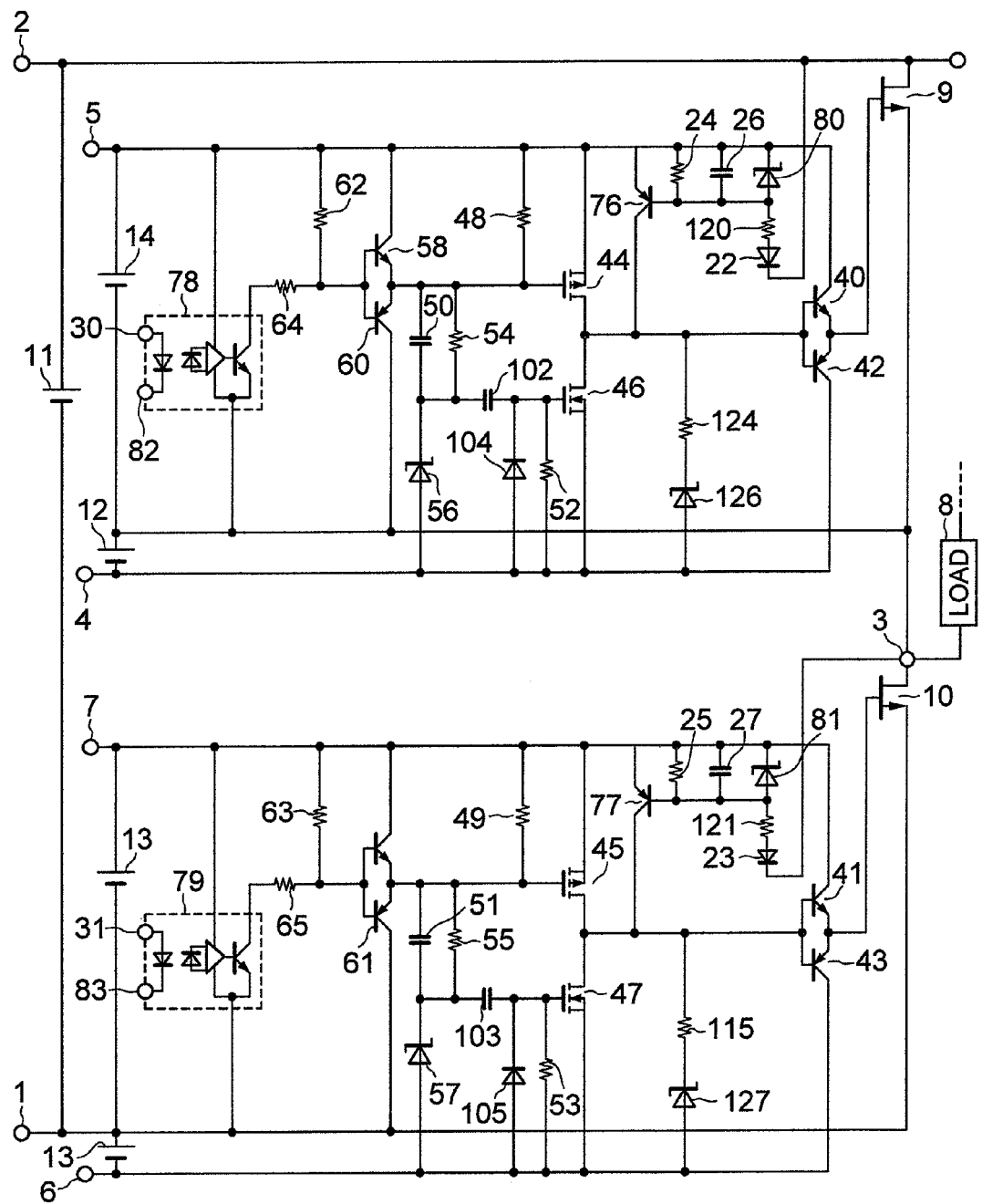
FIG. 12 shows a semiconductor circuit as a ninth embodiment of this invention.

FIG. 12 shows a semiconductor circuit as a ninth embodiment of this invention. In FIG. 12, the block diagram shown as the eighth embodiment in FIG. 11 is replaced by a concrete, detailed circuit of practical example. In this embodiment, transistors 76, 77 correspond to comparator circuits 18, 19, respectively. Since the outputs of the photo-couplers 78, 79 are at high potentials when the input terminals 30, 31 are at low potential, the outputs of the inverting circuit consisting of MOSFETs 44, 46 and the inverting circuit consisting of MOSFETs 45, 47 are low voltages. However, the provision of capacitors 102, 103 cause the outputs of the inverting circuit consisting of MOSFETs 44, 46 and the inverting circuit consisting of MOSFETs 45, 47 to be low voltages when the potentials at the input terminals 30, 31 change from high to low levels. Then, the capacitors 102, 103 are continuously charged with the lapse of time since currents flow through resistors 52, 53, so that all the MOSFETs 44-47 are cut off or develop high impedances. At that time, the power switching elements 9, 10 are held in the "off" states. Accordingly, even if transistors 76, 77 are turned on as the synchronous rectifying drive operation is initiated, excessive currents never flow through the MOSFETs 46, 47.

Due to the provision of zener diodes 126, 127, the power switching elements 9, 10 are rendered off or nearly off when threshold voltages are about to be reached. Consequently, the power switching elements 9, 10 can be swiftly turned on when the synchronous rectifying drive operation is initiated. Even if the instants at which the power switching elements are turned on are delayed, the reverse voltage drops across the power switching elements 9, 10 in the backflow operation mode then taking place can be reduced to small values.

With this circuit configuration, too, the same advantages can be obtained as with the first or second embodiment described above.

Embodiment 10

Figure 13:
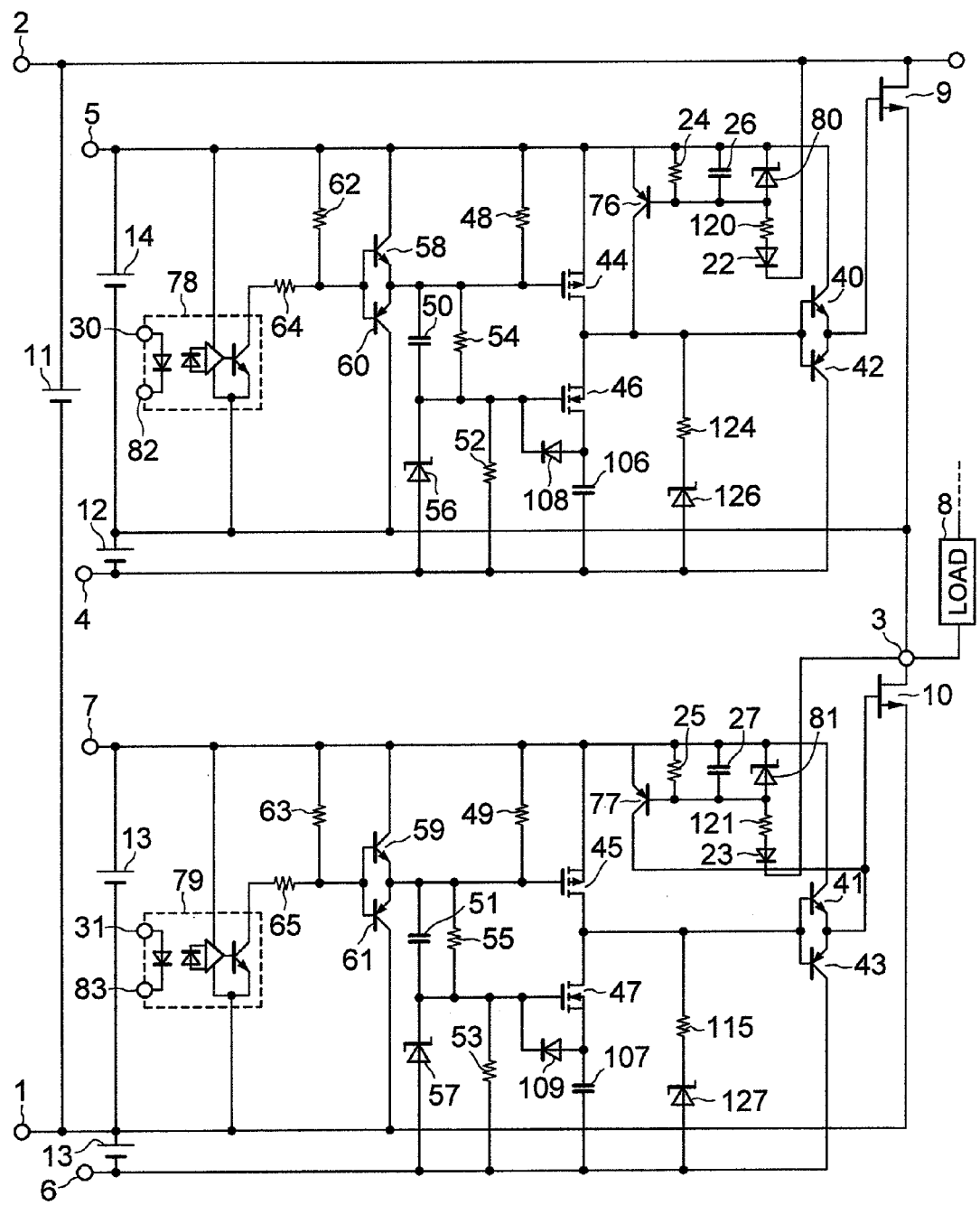
FIG. 13 shows a semiconductor circuit as a tenth embodiment of this invention.

FIG. 13 shows a semiconductor circuit as a tenth embodiment of this invention. In FIG. 13, too, the block diagram shown as the eighth embodiment in FIG. 11 is replaced by another concrete, detailed circuit of practical example. In this embodiment, when the input terminals 30, 31 are kept at low potentials, capacitors 106, 107 are charged up to turn off all the MOSFETs 44-47 or to render them all to the states of high impedances. Consequently, even if the transistors 76, 77 are turned on in the synchronous rectifying drive operation, excessive currents never flow through the MOSFETs 46, 47.

Diodes 108, 109 are provided to release the electric charges accumulated in the capacitors 106, 107.

With this circuit configuration, too, the same advantage can be obtained as with the ninth embodiment shown in FIG. 12.

Embodiment 11

Figure 14:
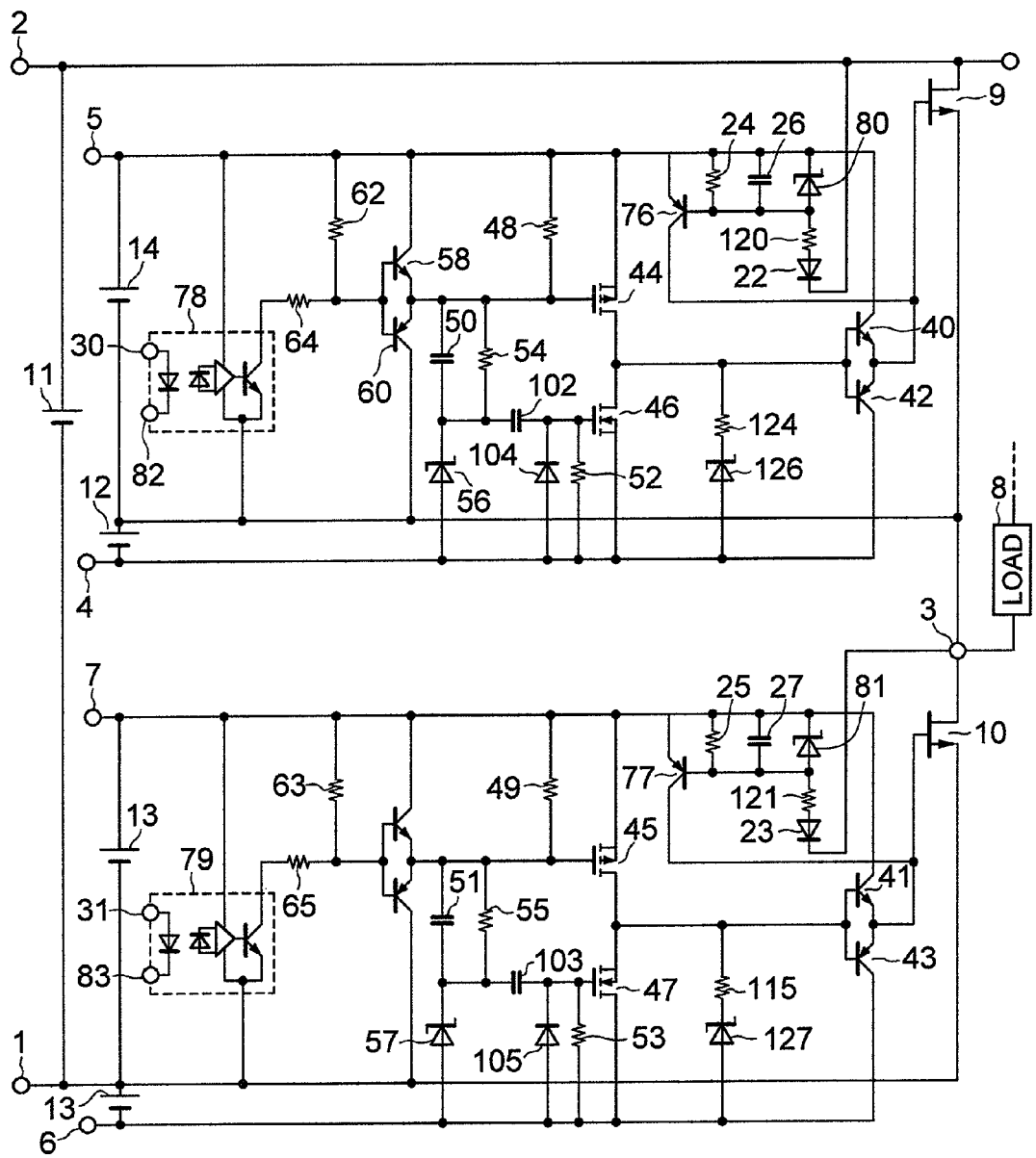
FIG. 14 shows a semiconductor circuit as an eleventh embodiment of this invention.

FIG. 14 shows a semiconductor circuit as an eleventh embodiment of this invention. In FIG. 14, too, the block diagram shown as the eighth embodiment in FIG. 11 is replaced by still another concrete, detailed circuit of practical example. In this embodiment, which is similar to the ninth embodiment shown in FIG. 12, is different from the ninth embodiment and characterized, in that the transistors 76, 77 serving as the comparator circuits 18, 19 in FIG. 1 are not connected with the input terminals of the non-inverting drive circuits consisting of transistors 40, 42, 41, 43, but directly with the gates of the power switching elements.

With this circuit configuration, although loss somewhat increases, the same advantage can be obtained as with the ninth embodiment shown in FIG. 12.

Embodiment 12

Figure 15:
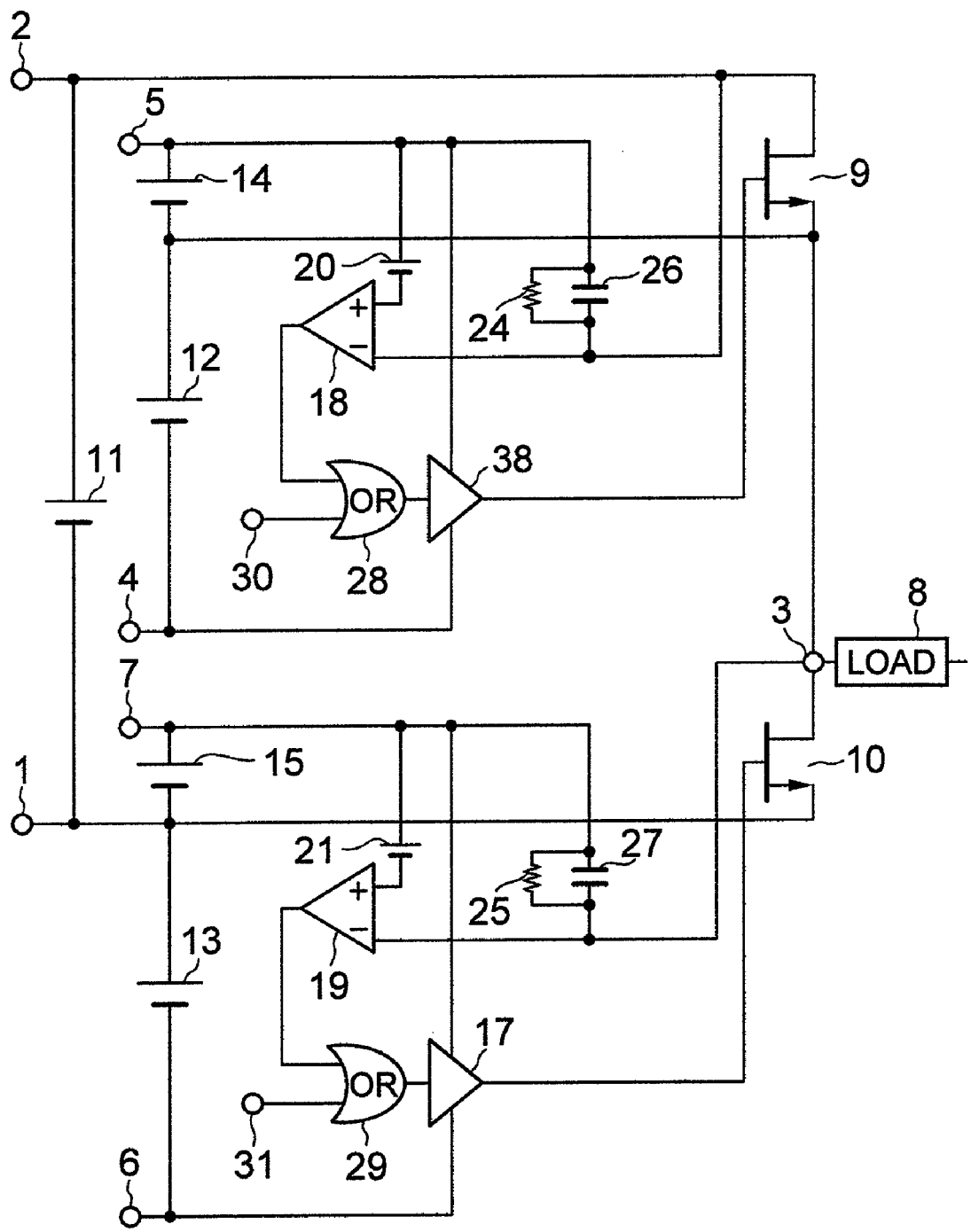
FIG. 15 shows a semiconductor circuit as a twelfth embodiment of this invention.

FIG. 15 shows a semiconductor circuit as a twelfth embodiment of this invention. In this embodiment, the high voltage diodes 22, 23 and the zener diodes 80, 81 used in the first embodiment shown in FIG. 1 are dispensed with. This embodiment is suitable for the case where the drive circuits do not withstand high voltages or where the comparator circuits can be composed of circuit elements all capable of withstanding high voltages.

With this circuit configuration, too, the same advantages can be obtained as with the first or second embodiment described above.

Embodiment 13

Figure 16:
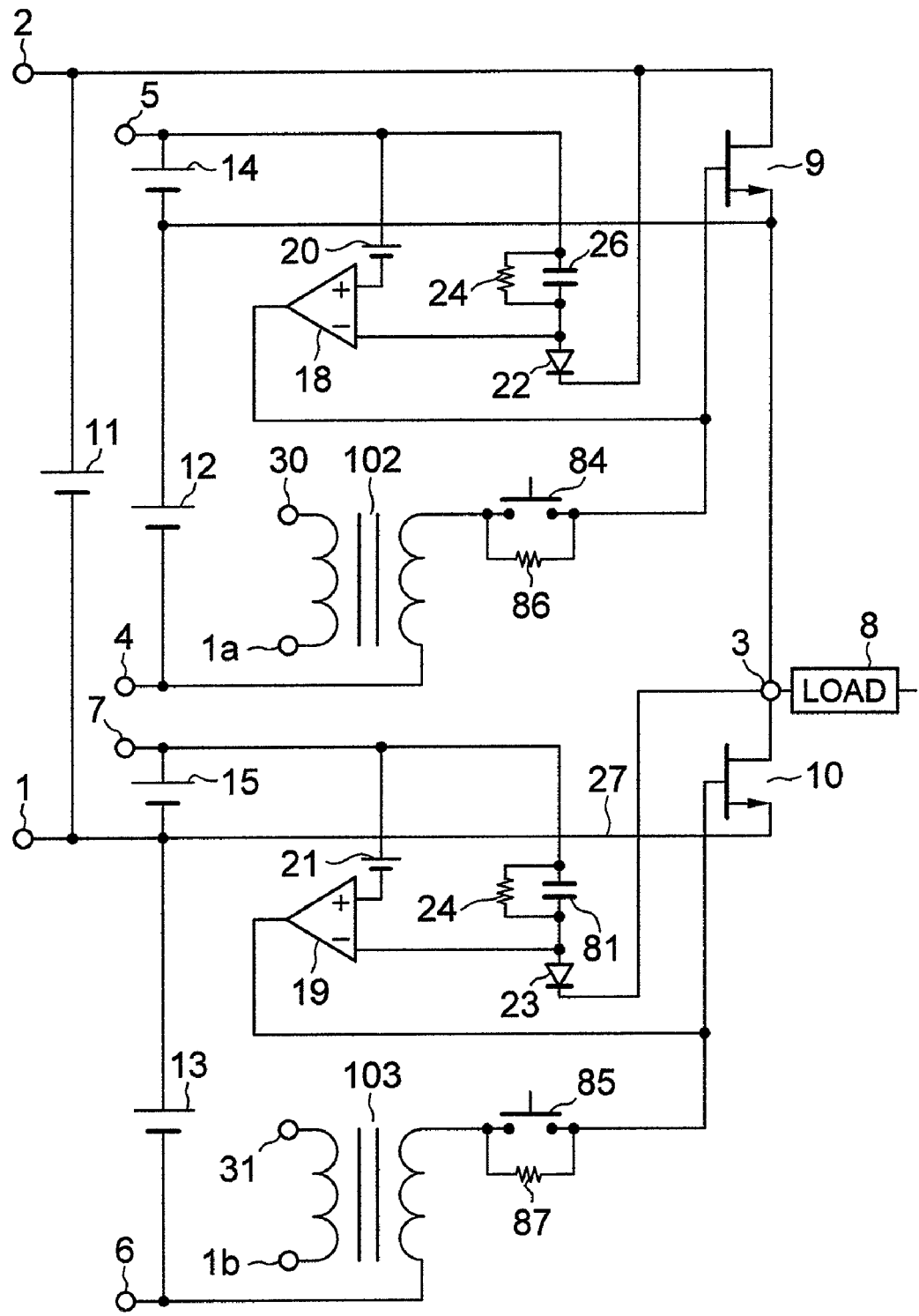
FIG. 16 shows a semiconductor circuit as a thirteenth embodiment of this invention.

FIG. 16 shows a semiconductor circuit as a thirteenth embodiment of this invention. In this embodiment, the drive circuits use pulse transformers 102, 103, and the second control signals are applied to the gates of the power switching elements 9, 10 through the pulse transformers 102, 103. The rest of the circuit configuration is the same as the circuit shown as the eighth embodiment in FIG. 11.

With this circuit configuration, too, the same advantages can be obtained as with the first or second embodiment described above.

Embodiment 14

Figure 17:
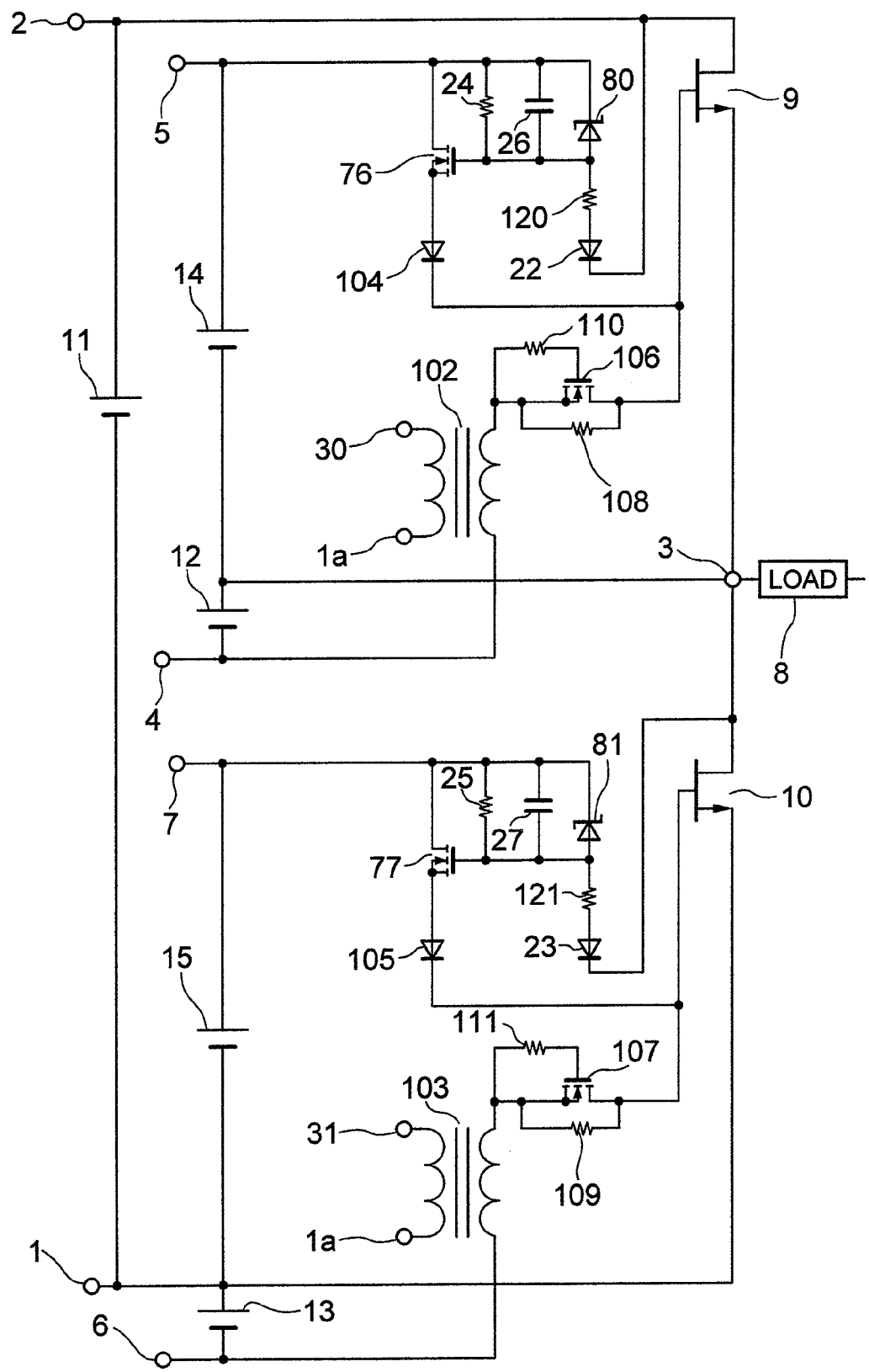
FIG. 17 shows a semiconductor circuit as a fourteenth embodiment of this invention.

FIG. 17 shows a semiconductor circuit as a fourteenth embodiment of this invention. In FIG. 17, the semiconductor circuit shown as the thirteenth embodiment in FIG. 16 is replaced by a concrete, detailed circuit of practical example. In this embodiment, when high voltage signals for turning on the power switching elements are applied to the input terminals 30, 31, the built-in diodes integrated between the drains and sources of the body-source-connected MOSFETs 106, 107 are forwardly biased to turn on the power switching elements 9, 10. When the potentials at the input terminals 30, 31 shift from high to low levels, the potentials at the sources of the MOSFETs 106, 107 fall swiftly. Accordingly, voltages are temporarily applied between the gates and sources of the MOSFETs 106, 107 so that the MOSFETs 106, 107 are turned on. Consequently, the power switching elements 9, 10 are turned off. The high-resistance resistors 110, 111 cause the MOSFETs 106, 107 to be turned off before long. Due to the provision of the high-resistance resistors 110, 111, however, the gate terminals of the power switching elements 9, 10 are isolated by the high resistance. Hence, reverse voltages or quasi-reverse voltages are applied between the drains and sources of the power switching elements 9, 10, and when MOSFETs 76, 77 are turned on, the power switching elements 9, 10 are swiftly turned on without excessive currents flowing through the MOSFETs 106, 107, whereby the synchronous rectifying drive is performed.

With this circuit configuration, too, the same advantages can be obtained as with the first or second embodiment described above.

Embodiment 15

Figure 18:
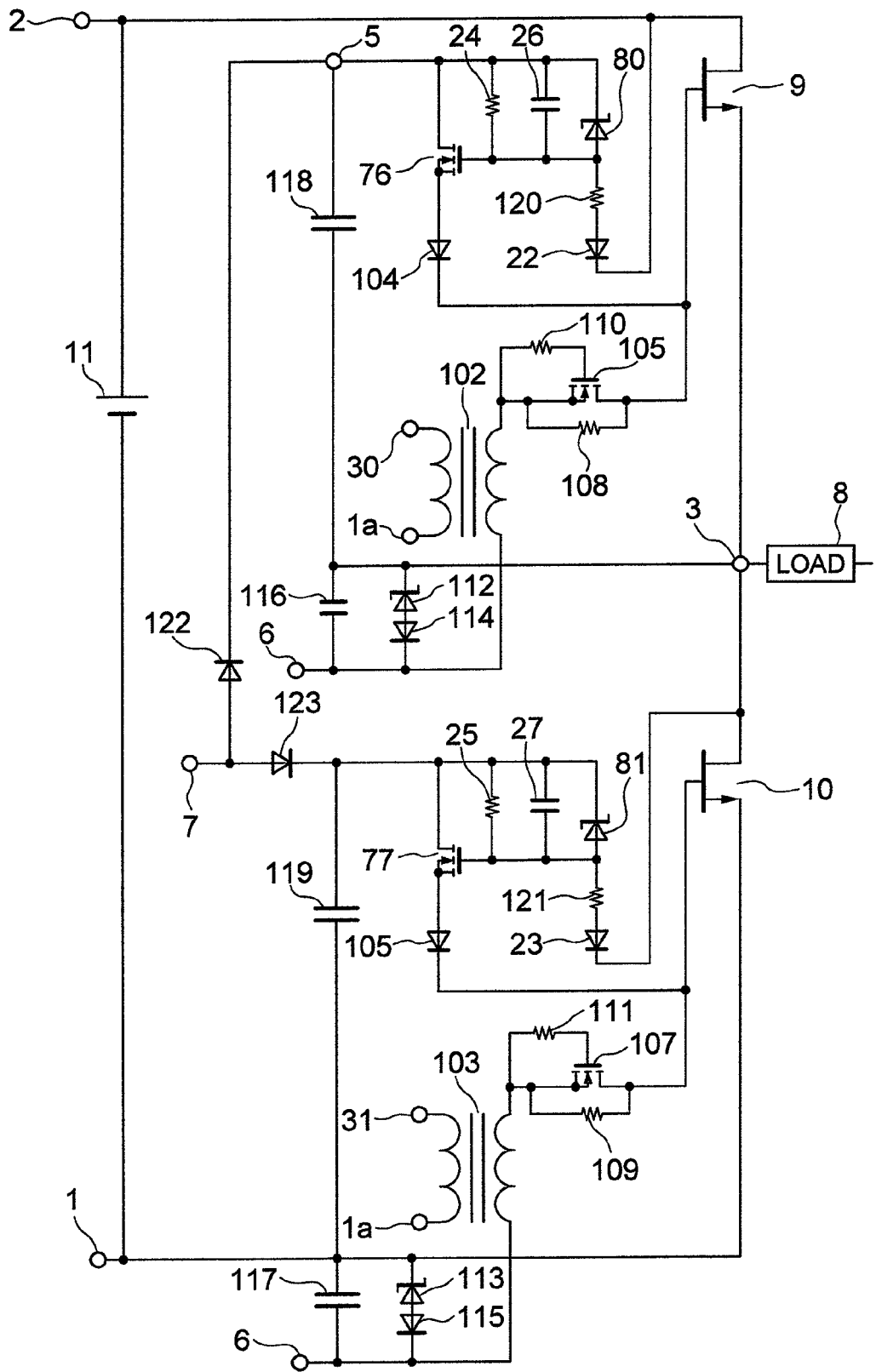
FIG. 18 shows a semiconductor circuit as a fifteenth embodiment of this invention.

FIG. 18 shows a semiconductor circuit as a fifteenth embodiment of this invention. This embodiment is characterized in that the power sources 14, 15, 12, 13 shown in FIG. 17 are replaced by capacitors 118, 119, 116, 117, respectively, that the capacitor 118 is charged through the boot-strap operation using a diode 122, and that the capacitors 116, 117 are charged through the pulsing operation of the pulse circuits 102, 103. This circuit configuration has an advantage that the number of power sources can be diminished. Diode 123 is so provided as to make the voltage across the capacitors 119 and the voltage across the capacitor 118 almost equal to each other, but the diode 123 may be dispensed with. It goes without saying that the way of generating a positive voltage through the boot-strap operation described in this embodiment can also be applied to other embodiments of this invention.

With this circuit configuration, too, the same advantages can be obtained as with the first or second embodiment described above.

Embodiment 16

Figure 19:
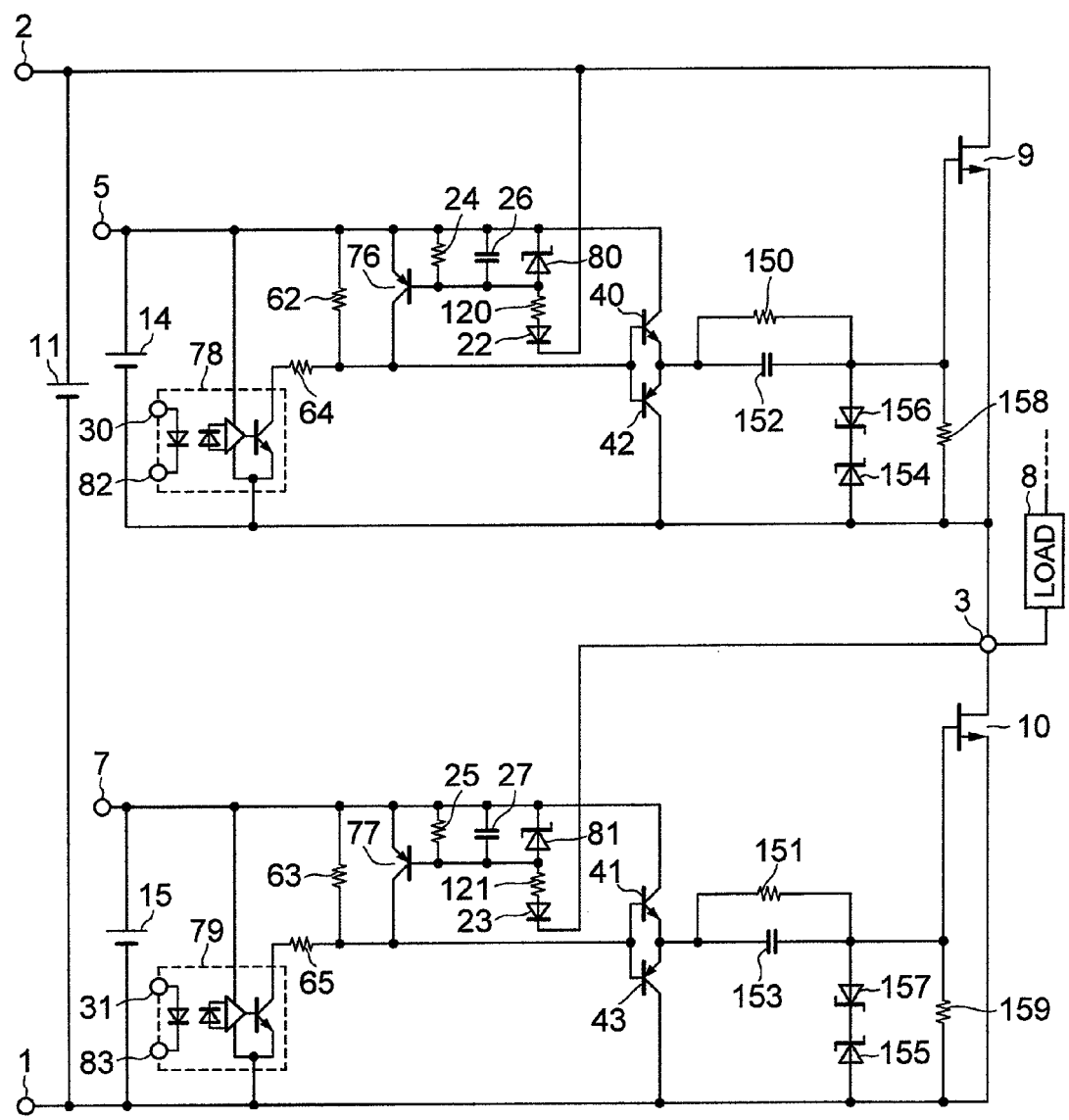
FIG. 19 shows a semiconductor circuit as a sixteenth embodiment of this invention.

FIG. 19 shows a semiconductor circuit as a sixteenth embodiment of this invention. In this embodiment, SiC JFETs of "normally off" type, MESFETs of "normally off" type, or bipolar transistors having high current gains are used as the power switching elements 9, 10. Further, positive voltages are available at the terminals 5, 7 of the positive voltage sources 14, 15 and set to, for example, 15V. Capacitors 152, 153 must have capacitances sufficiently larger than the input capacitances of the power switching elements 9, 10. When JFETs of "normally off" type are used as the power switching elements 9, 10, and turned on, the capacitors 152, 153 are charged through the diodes existing internally between the gates and sources of the JFETs of "normally off" type. At this time, since the forward voltages across the p-n junctions of the SiC JFETs are about 2.5V, the capacitors 152, 153 are charged up to about 10V through 13V at most. Then, gate currents flow and are finally limited by the parallel circuits of capacitors 152, 153 and the resistors 150, 151 to keep the power switching elements in the "on" states. The values of the resistors 150, 151 depend on the maximum gate-source biases or the leak current levels, but should be set as large as possible. In order to turn off the JFETs 9, 10 of "normally off" type, the inputs to the emitter follower circuits consisting of transistors 40-43 are reduced to zero volt (0V). Then, the voltages across the capacitors 152, 153 are maintained almost intact so that the voltages at the gate electrodes of the JFETs 9, 10 of normally "off" type are reduced to about −7V to −12V, thereby turning off the JFETs 9, 10. In this way, in the semiconductor circuit of this embodiment, the voltages at the gates of the the JFETs 9, 10 can be rendered negative though only positive voltage sources are used, and such an erroneous operation as self-turning on can be avoided.

With this circuit, it is preferable to turn on the power switching elements of "normally off" type immediately before the high voltage of the high voltage source 11 is applied between the high voltage terminal 2 and the reference voltage terminal 1 and thereafter to turn off the power switching elements of "normally off" type. When this operation is performed, the voltages at the gates of the power switching elements of "normally off" type are rendered negative. Accordingly, the erroneous operation can be prevented that the power switching elements 9, 10 are untimely turned on due to the capacitive coupling between the gates and drains of the power switching elements 9, 10 while the voltage of the high voltage power source 11 are rising.

Zener diodes 154, 155 are provided to prevent excessive voltages from being applied between the gates and sources of the power switching elements of "normally off" type. Immediately after the power switching elements 9, 10 of "normally off" type are swiftly turned on, high voltages tend to be applied between the gates and sources of the JFETs of "normally off" type. The zener diodes 154, 155 serve to suppress such voltage stresses. If there is no possibility that the switching elements deteriorate due to such voltage stresses, the zener diodes can be dispensed with. Diodes 156, 157 have sufficiently high withstand voltages so as to enable negative voltages to be applied to the gates of the JFETs of "normally off" type even in the case of the zener diodes 154, 155 being provided. If the withstand voltages between the gates and sources of the power switching elements 9, 10 "normally off" type are low, the diodes 156, 157 may be replaced by zener diodes serving as protective diodes to suppress the amplitudes of the negative gate voltages.

The circuit configuration of this embodiment can also be applied to the case where the JFETs are replaced by other power switching elements of "normally off" type such as, for example, MESFETs or bipolar transistors having high current gains.

With such power switching elements of "normally off" type and in the same way as with the embodiment shown in FIG. 1 or FIG. 8, the instants at which the synchronous rectifying drive should be initiated are determined by comparing the voltages at the drains of the power switching elements 9, 10 with the reference voltage by means of the comparator circuits and the state holding circuits composed of transistors 76, 77, capacitors 26, 27, resistors 24, 25, and high voltage diodes 22, 23. When the instants are determined, the first control signals are generated and continue to be delivered, that is, the state of the first control signals being outputted is held. When the first control signals thus generated or the second control signals for controlling the fundamental drive of the power switching elements 9, 10 are the "on" signal, the power switching elements 9, 10 are turned on.

Accordingly, with this circuit configuration, too, the same advantages can be obtained as with the first or second embodiment described above.

Embodiment 17

Figure 20:
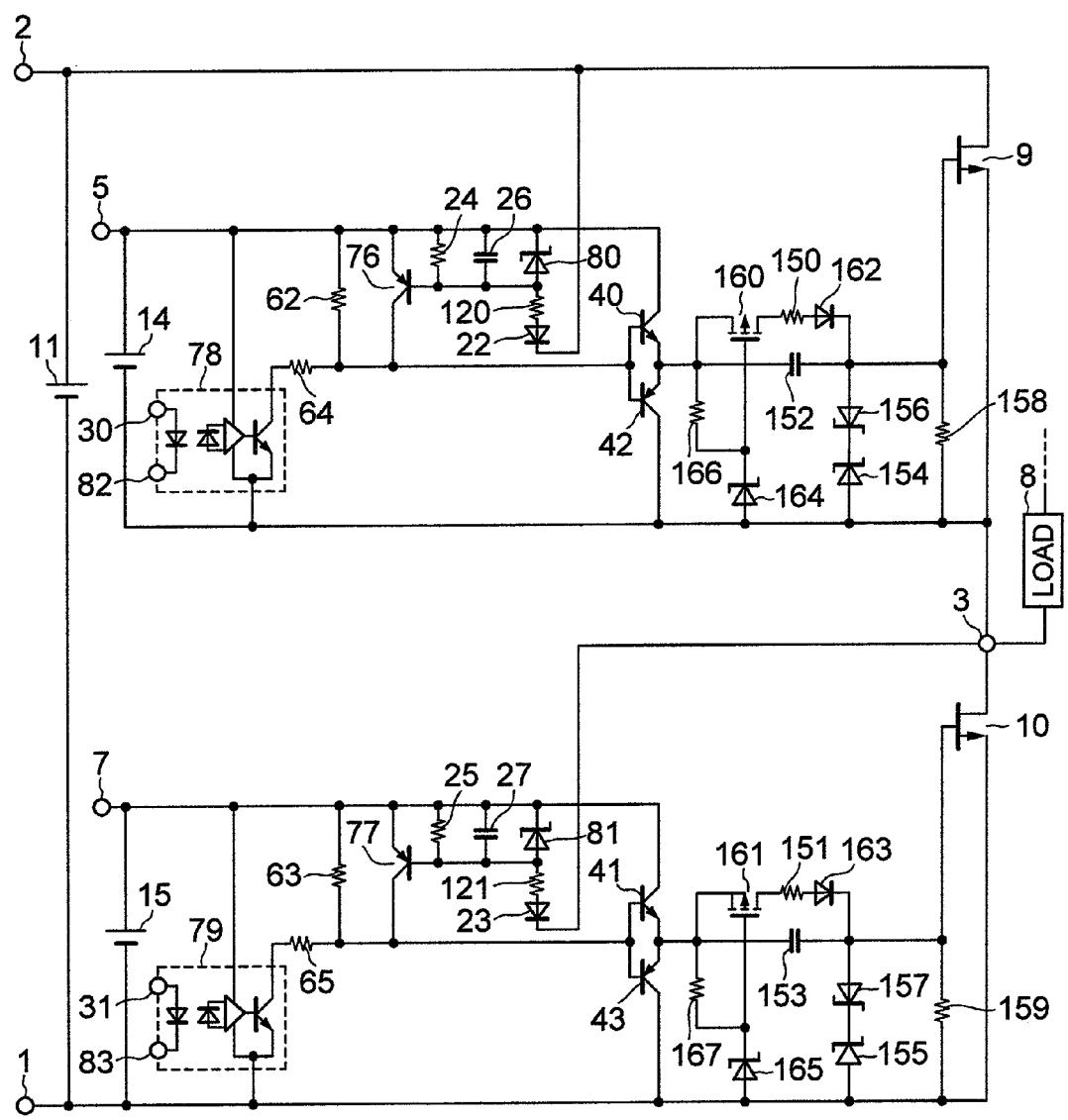
FIG. 20 shows a semiconductor circuit as a seventeenth embodiment of this invention.

FIG. 20 shows a semiconductor circuit as a seventeenth embodiment of this invention. This embodiment is similar to the sixteenth embodiment shown in FIG. 19, but a small scale modification is introduced to reduce the power consumption when the power switching elements 9, 10 are turned off. In the semiconductor circuit shown in FIG. 19, the electric charges accumulated in the capacitors 152, 153 are released through the resistors 150, 151 when the power switching elements 9, 10 are turned off, and currents flow from the transistors 40, 41 to the resistors 150, 151. Accordingly, if the values of the resistors 150, 151 are small, the currents through them increase to bring about a problem of power loss. On the other hand, in this seventeenth embodiment shown in FIG. 20, switching elements 160, 161 are provided in the current paths composed mainly of resistors 150, 151 connected in parallel to the capacitors 152, 153. The switching elements 160, 161 are p-channel MOSFETs, and their gate terminals are connected to the source terminal side of the power switching elements 9, 10, and their source terminals are connected with the output terminals of the previous stages. Further, zener diodes 164, 165 are connected between the gate terminals of the p-channel MOSFETs 160, 161 and the source (emitter) terminals of the power switching elements 9, 10, respectively, and high-resistance resistors 166, 167 are connected between the gate and source terminals of the p-channel MOSFETs 160, 161. This enables the circuit to operate even if the gate-source withstand voltages of the p-channel MOSFETs 160, 161 is lower than the voltages of the power sources 14, 15. If the gate-source withstand voltages of the p-channel MOSFETs 160, 161 are sufficiently high, the zener diodes 164, 165 and the high-resistance resistors 166, 167 can be dispensed with. Diodes 162, 163 are provided to suppress the reverse currents that may flow through the resistors 150, 151. If there is no possibility of the reverse current flowing through the resistors 150, 151, the diodes 162, 163 can also be dispensed with.

With this circuit configuration, too, the same advantages can be obtained as with the first or second embodiment described above.

Embodiment 18

Figure 21:
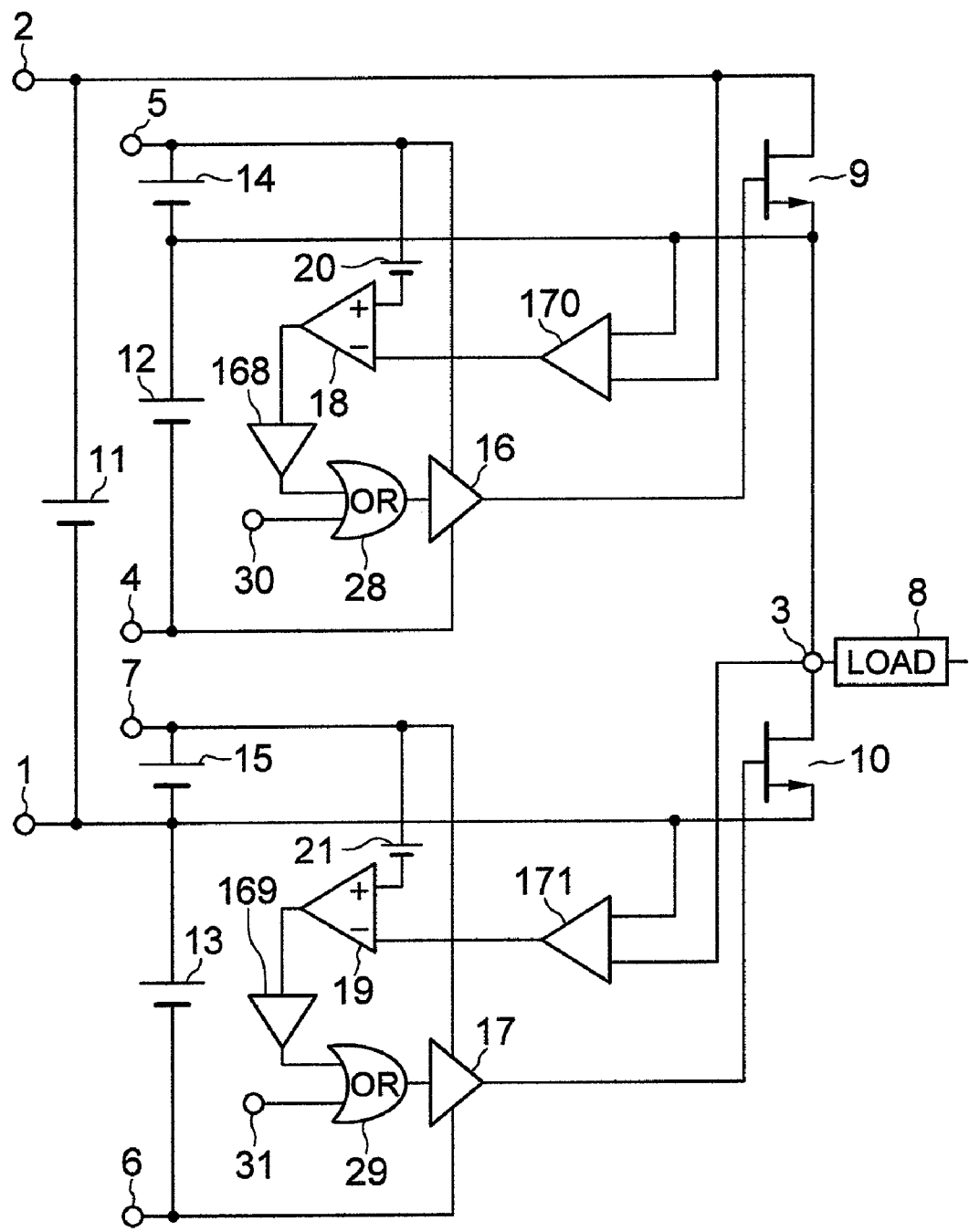
FIG. 21 shows a semiconductor circuit as an eighteenth embodiment of this invention.

FIG. 21 schematically shows a semiconductor circuit as an eighteenth embodiment of this invention. In this embodiment, potential difference detecting circuits 170, 171 serve to detect the potential differences between the drain terminals and source terminals of the power switching elements 9, 10. The comparator circuits 18, 19 judge whether or not the outputs of the potential difference detecting circuits 170, 171 satisfy the condition for initiating the synchronous rectifying drive, on the basis of the reference voltages 20, 21 biased with the power sources 14, 15. The result of judgment, i.e. the outputs of the comparator circuits 18, 19, are fed to the temporary state holding circuits 168, 169, which generate the first control signals. On the other hand, the second control signals that are the ordinary control signals for controlling the power switching elements 9, 10 are inputted at the terminals 30, 31. The first and second control signals are fed to the OR circuits 28, 29, and if the first control signals or the second control signals are causative of the "on" control signals, the "on" control signals turn on the power switching elements 9, 10 by dint of the drive circuits 16, 17. The use of the temporary state holding circuits 168, 169 enables the first control signals to subject the power switching elements 9, 10 to the synchronous rectifying drive operation until the "on" control signals for initiating the synchronous rectifying drive operation are inputted at the terminals 30, 31.

The operation of the overall semiconductor circuit can be further stabilized by providing hysteresis circuits or filters for eliminating noise in the potential difference detecting circuits 170, 171.

In the detection of the drain-source voltages of the power switching elements 9, 10 by the potential difference detecting circuits 170, 171, such high voltage diodes 22, 23 as shown in FIG. 1 may be inserted between the input terminals of the potential difference detecting circuits 170, 171.

The semiconductor circuit shown in FIG. 21 is only one of possible embodiments of this invention, and therefore the layout of the circuit elements may be differently arranged so far as the same function can be attained.

With this circuit configuration, too, the same advantages can be obtained as with the first or second embodiment described above.

Throughout this specification, this invention has been described as applied to the cases where free wheel diodes are not provided between the drains and sources (collectors and emitters) of the power switching elements. If the PN junction diodes or Schottky diodes made of wide band gap semiconductors, such as SiC or GaN, are connected between the drains and sources (collectors and emitters) of the power switching elements, an advantage can be obtained that low loss drive can be effected even though the timing of the synchronous rectifying drive is somewhat shifted, because the currents, which are in reverse direction to the power switching elements, can flow through the wide band gap semiconductor diodes.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor circuit including power switching elements for performing switching control, comprising:
    means for detecting voltages between the drains and sources of the power switching elements;
    means for defining a specific voltage developed immediately before or immediately after the detected voltages assume reverse polarity, as a voltage of the synchronous rectifying drive performed due to the first control signals;
    means for changing the first control signals from "off" signals to "on" signals if voltages between the drains and sources of the switching elements satisfy a condition for the synchronous rectifying drive performed due to the first control signals;
    means for holding the power switching elements in the "on" states by causing the first control signals to continue to be the "on" control signals for an ensuing constant period of time, irrespective of whether or not the voltages between the drains and sources of the power switching elements satisfy the condition for the synchronous rectifying drive due to the first control signals, and
    control means operated by second control signals for controlling the power switching elements,
    wherein the power switching elements are configured to turn on when the first control signals and/or the second control signals are the "on" drive signals, and
    wherein a first period during which the first control signals are the "on" drive signals, and
    wherein a first period during which the first control signals continue to be the "on" control signals is set longer than a second period during which the power switching elements can remain driven in the "on" states after the second control signals change from the "off" control signals to the "on" control signals.

2. A semiconductor circuit as claimed in claim 1, wherein when the second control signal arrive to turn off the power switching elements which have initiated the "on" drive on the basis of the synchronous rectifying drive condition and continued the "on" drive operation, the period during which the first control signals continue to be the "on" control signals terminates before the second control signals have changed from the "on" control signals to the "off" control signals so that the power switching elements can be swiftly turned off.

3. A semiconductor circuit as claimed in claim 1, wherein if the first control signals or the second control signals are the "on" control signals, the power switching elements are turned on.

4. A semiconductor circuit as claimed in claim 1, wherein the power switching elements are junction type FETs.

5. A semiconductor circuit as claimed in claim 1, wherein the power switching elements are MOSFETs.

6. A semiconductor circuit including power switching elements for performing switching control, comprising:
- means for detecting voltages between the drains and sources of the power switching elements and rates of changes in the voltages between the drains and sources of the power switching elements;
- means for defining a predetermined condition immediately before or immediately after the voltages between the drains and sources assume reverse polarity, as a condition for a synchronous rectifying drive performed due to first control signals;
- means for changing the first control signals from "off" signals to "on" signals if the condition for the synchronous rectifying drive due to the first control signals is satisfied;
- means for holding the power switching elements in the "on" states by causing the first control signals to continue to be the "on" control signals for an ensuring constant period of time, irrespective of whether or not the voltages between the drains and sources of the power switching elements satisfy the condition for the synchronous rectifying drive due to the first control signals, and
- control means operated by second control signals for controlling the power switching elements,
- wherein the power switching elements are configured to turn on when the first control signals and/or the second control signals are the "on" drive signals, and
- wherein a first period during which the first control signals continue to be the "on" control signals is set longer than a second period during which the power switching elements can remain driven in the "on" states after the second control signals change from the "off" control signals to the "on" control signals.

7. A semiconductor circuit as claimed in claim 6, wherein when the second control signal arrive to turn off the power switching elements which have initiated the "on" drive on the basis of the synchronous rectifying drive condition and continued the "on" drive operation, the period during which the first control signals continue to be the "on" control signals terminates before the second control signals have changed from the "on" control signals to the "off" control signals so that the power switching elements can be swiftly turned off.

8. A semiconductor circuit as claimed in claim 6, wherein if the first control signals or the second control signals are the "on" control signals, the power switching elements are turned on.

9. A semiconductor circuit as claimed in claim 6, wherein the power switching elements are junction type FETs.

\* \* \* \* \*